United States Patent
Kim

(10) Patent No.: US 10,911,068 B2
(45) Date of Patent: Feb. 2, 2021

(54) ERROR CORRECTION CIRCUIT AND METHOD OF OPERATING THE SAME

(71) Applicant: SK hynix Inc., Gyeonggi-do (KR)

(72) Inventor: Kyung Bum Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 56 days.

(21) Appl. No.: 16/220,681

(22) Filed: Dec. 14, 2018

(65) Prior Publication Data

US 2019/0334549 A1    Oct. 31, 2019

(30) Foreign Application Priority Data

Apr. 30, 2018  (KR) ................. 10-2018-0050213

(51) Int. Cl.
*H03M 13/11* (2006.01)
*G06F 11/10* (2006.01)
*H03M 13/15* (2006.01)

(52) U.S. Cl.
CPC ..... *H03M 13/1111* (2013.01); *G06F 11/1044* (2013.01); *H03M 13/1575* (2013.01)

(58) Field of Classification Search
CPC .......... H03M 13/1111; H03M 13/1575; H03M 13/6325; H03M 13/3723; G06F 11/1044
See application file for complete search history.

(56) References Cited

U.S. PATENT DOCUMENTS

| | | | |
|---|---|---|---|
| 9,009,576 B1 | 4/2015 | Jeon et al. | |
| 2011/0320902 A1* | 12/2011 | Gunnam | H03M 13/1128 714/752 |
| 2013/0346824 A1* | 12/2013 | Bolotov | H03M 13/1111 714/755 |
| 2014/0281828 A1* | 9/2014 | Micheloni | G06F 11/00 714/773 |

FOREIGN PATENT DOCUMENTS

KR    1020160102738    8/2016

* cited by examiner

*Primary Examiner* — Thien Nguyen
(74) *Attorney, Agent, or Firm* — IP & T Group LLP

(57) ABSTRACT

There are provided an error correction circuit and a method of operating the same. The circuit may performs error correction decoding within a maximum global iteration number G, and may include a mapper configured to generate read values quantized into g+1 levels to be used in a g-th global iteration by using read values corresponding to g number of read voltages, a node processing component configured to perform error correction decoding, during the g-th global iteration, by using the read values quantized into g+1 levels, a syndrome information management component configured to manage syndrome information corresponding to the g-th global iteration, and a global iteration control component configured to, when error correction decoding fails in the g-th global iteration, determine whether the syndrome information corresponding to the g-th global iteration satisfies a condition defined in a global iteration skip policy, and decide whether to skip (g+1)th to (G−1)th global iterations.

18 Claims, 17 Drawing Sheets

$$H = \begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix}$$

$$\begin{bmatrix} 1 & 0 & 1 & 0 & 1 & 0 & 0 \\ 0 & 1 & 0 & 1 & 0 & 1 & 0 \\ 1 & 0 & 0 & 1 & 0 & 0 & 1 \end{bmatrix} \times \begin{bmatrix} 1 \\ 0 \\ 1 \\ 1 \\ 0 \\ 1 \\ 0 \end{bmatrix} = \begin{bmatrix} r_1 \\ r_2 \\ r_3 \end{bmatrix}$$

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | −6 | +5 | | | | | | |
| 3 | −5 | −2 | +6 | | | | | |
| 4 | −5 | +1 | +2 | +6 | | | | |
| 5 | −5 | −4 | −2 | −1 | +6 | | | |
| 6 | −6 | +1 | +2 | +4 | +5 | +6 | | |
| 7 | −6 | −5 | −4 | −2 | −1 | +1 | +6 | |
| 8 | −5 | −1 | +1 | +2 | +4 | +5 | +6 | +7 |

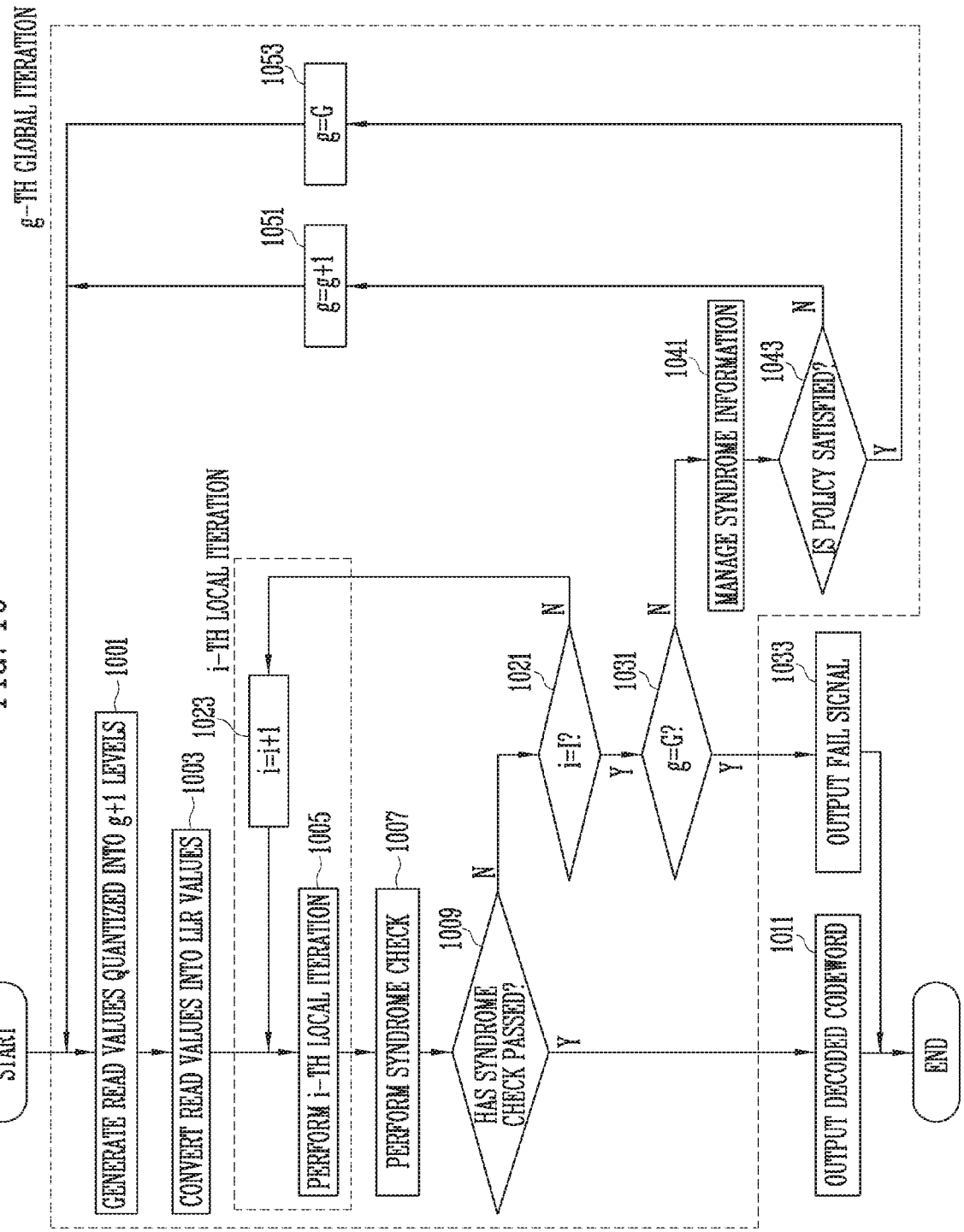

FIG. 11

| GLOBAL ITERATION SKIP POLICY | | |
|---|---|---|
| | CONDITION | ACTION |
| FIRST CONDITION | NUMBER OF UCNS IN CURRENT GLOBAL ITERATION IS GREATER THAN THRESHOLD VALUE | PERFORM LAST GLOBAL ITERATION |
| SECOND CONDITION | NUMBER OF UCNS IN CURRENT GLOBAL ITERATION IS EQUAL TO NUMBER OF UCNS IN IMMEDIATELY PRECEDING GLOBAL ITERATION | PERFORM LAST GLOBAL ITERATION |
| THIRD CONDITION | NUMBER OF UCNS IN CURRENT GLOBAL ITERATION IS GREATER THAN NUMBER OF UCNS IN IMMEDIATELY PRECEDING GLOBAL ITERATION | PERFORM LAST GLOBAL ITERATION |

FIG. 12

< WHEN FIRST CONDITION IS SATISFIED >

| SYNDROME INFORMATION | | |
|---|---|---|
| GLOBAL ITERATION | SYNDROME VECTOR | NUMBER OF UCNS |
| 1ST GLOBAL ITERATION | 1 0 1 1 1 | 4 |

FIG. 13A

< WHEN SECOND CONDITION IS SATISFIED >

| SYNDROME INFORMATION | | |
|---|---|---|
| GLOBAL ITERATION | SYNDROME VECTOR | NUMBER OF UCNS |
| 1ST GLOBAL ITERATION | 1 0 1 1 1 | 4 |
| 2ND GLOBAL ITERATION | 1 1 0 1 1 | 4 |

FIG. 13B

< WHEN THIRD CONDITION IS SATISFIED >

| SYNDROME INFORMATION | | |
|---|---|---|
| GLOBAL ITERATION | SYNDROME VECTOR | NUMBER OF UCNS |
| 1ST GLOBAL ITERATION | 1 0 0 1 1 | 3 |
| 2ND GLOBAL ITERATION | 1 1 0 1 1 | 4 |

ERROR CORRECTION CIRCUIT AND METHOD OF OPERATING THE SAME

CROSS-REFERENCE TO RELATED APPLICATION

The present application claims priority under 35 U.S.C. § 119(a) to Korean patent application number 10-2018-0050213, filed on Apr. 30, 2018, which is incorporated herein by reference in its entirety.

BACKGROUND

Field of Invention

Various embodiments of the present disclosure generally relate to an error correction circuit and a method of operating the error correction circuit. Particularly, the embodiments relate to an error correction circuit for reducing the time required for error correction decoding and a method of operating the error correction circuit.

Description of Related Art

A memory system may store data provided from an external device, and may provide stored data to the external device. The memory system may include an error correction circuit to guarantee the reliability of data. The error correction circuit may perform encoding and decoding using an error-correction code.

A low density parity check (LDPC) code is a strong error-correction code. This is due to the characteristics of an LDPC iterative decoding scheme, in which error correction capability per bit is improved as the length of a code is increased, whereas computational complexity per bit remains unchanged.

SUMMARY

Various embodiments of the present disclosure are directed to an error correction circuit for reducing the time required for error correction decoding and a method of operating the error correction circuit.

An embodiment of the present disclosure may provide for an error correction circuit for performing error correction decoding within a maximum global iteration number G (where G is a natural number). The error correction circuit may include a mapper configured to generate read values quantized into g+1 levels to be used in a g-th global iteration by using read values respectively corresponding to g number of read voltages (where g is a natural number less than or equal to G), a node processing component configured to perform error correction decoding, during the g-th global iteration, using the read values quantized into g+1 levels, a syndrome information management component configured to manage syndrome information corresponding to the g-th global iteration, and a global iteration control component configured to, when error correction decoding fails in the g-th global iteration, determine whether the syndrome information corresponding to the g-th global iteration satisfies a condition defined in a global iteration skip policy, and decide whether to skip (g+1)th to (G−1)th global iterations based on a result of the determination.

An embodiment of the present disclosure may provide for a method of operating an error correction circuit, in which the error correction circuit performs error correction decoding within a maximum global iteration number G (where G is a natural number). The method may include generating read values quantized into g+1 levels to be used in a g-th global iteration by using read values respectively corresponding to g number of read voltages (where g is a natural number less than or equal to G), performing error correction decoding, during the g-th global iteration, using the read values quantized into g+1 levels, managing to syndrome information corresponding to the g-th global iteration, determining, when error correction decoding fails in the g-th global iteration, whether the syndrome information corresponding to the g-th global iteration satisfies a condition defined in a global iteration skip policy, and deciding whether to skip (g+1)th to (G−1)th global iterations depending on whether the syndrome information satisfies the condition.

An embodiment of the present disclosure may provide for a method of soft decision error correction code decoding a codeword based on a low density parity check code. The method may include performing iterations of a soft decision ECC decoding on the codeword according to a predetermined number of soft read voltages until the soft decision ECC decoding is of success, performing, when a result of a current iteration is not better than a threshold in view of a number of unsatisfied check nodes, a last iteration among the iterations by skipping remaining intermediate iterations, and performing, when a result of a current iteration is not better than a result of an immediately preceding iteration in view of a number of unsatisfied check nodes, a last iteration among the iterations by skipping remaining intermediate iterations.

BRIEF DESCRIPTION OF THE DRAWINGS

FIG. 9 is a diagram illustrating a lookup table according to an embodiment of the present disclosure.

FIG. 10 is a flowchart illustrating a method of operating the error correction circuit illustrated in FIGS. 1 and 2.

FIG. 11 is a diagram illustrating a global iteration skip policy according to an embodiment of the present disclosure.

FIG. 12 is a diagram illustrating a case where a first condition illustrated in FIG. 11 is satisfied.

FIGS. 13A and 13B are diagrams illustrating cases where a second condition and a third condition illustrated in FIG. 11 are respectively satisfied.

DETAILED DESCRIPTION

Advantages and features of the present disclosure, and methods for achieving the same will become more apparent with reference to embodiments described later in detail together with the accompanying drawings. The present disclosure is not limited to the following embodiments but embodied in other forms. Rather, these embodiments are provided so that the present disclosure will be thorough and complete, and will fully convey the technical spirit of the disclosure to those skilled in the art.

It is noted that reference to "an embodiment" does not necessarily mean only one embodiment, and different references to "an embodiment" are not necessarily to the same embodiment(s).

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

It is also noted that in this specification, "connected/coupled" refers to one component not only directly coupling another component but also indirectly coupling another component through an intermediate component. In the specification, when an element is referred to as "comprising" or "including" a component, it does not preclude another component but may further include other components unless the context clearly indicates otherwise.

The above-described exemplary embodiments are merely for the purpose of understanding the technical spirit of the present disclosure and the scope of the present disclosure should not be limited to the above-described exemplary embodiments. It will be obvious to those skilled in the art to which the present disclosure pertains that other modifications based on the technical spirit of the present disclosure may be made in addition to the above-described exemplary embodiments.

Hereinafter, embodiments of the present disclosure will be described with reference to the attached drawings.

Figure 1:
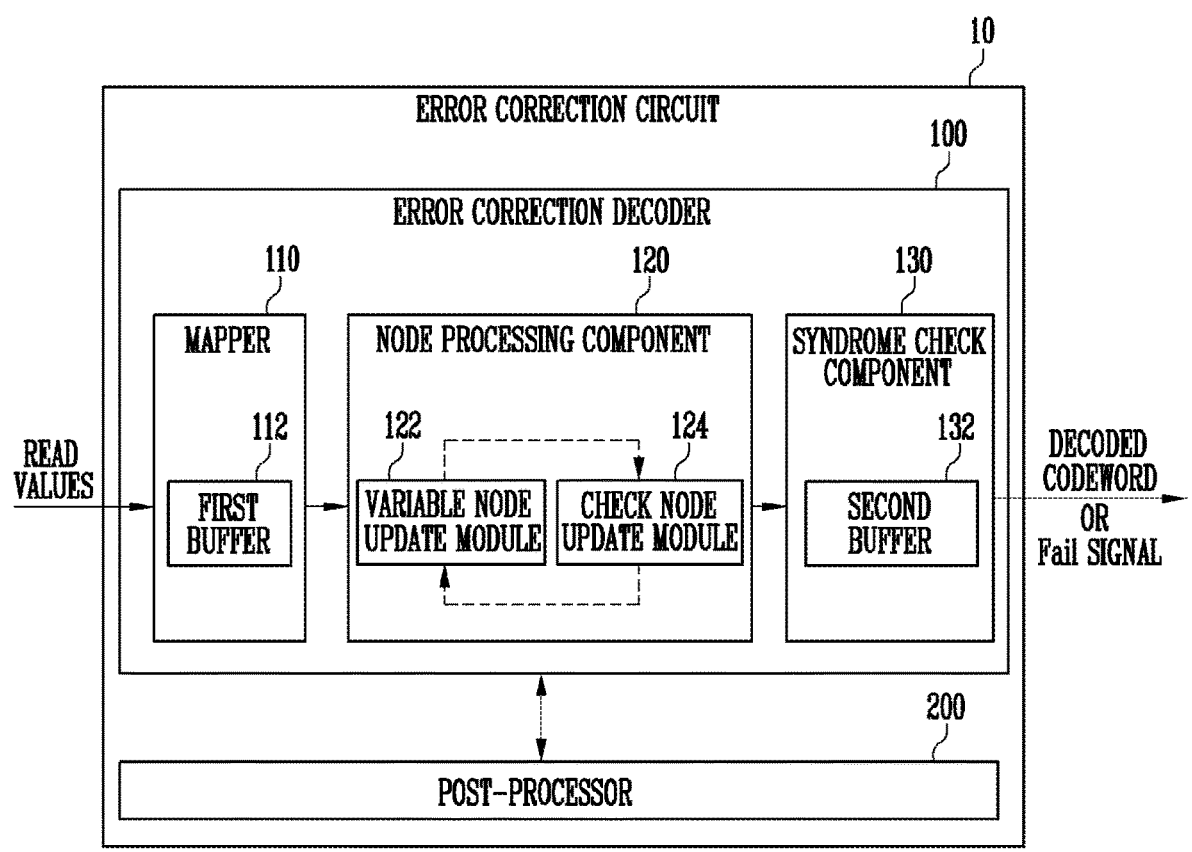
FIG. 1 is a diagram illustrating an error correction circuit according to an embodiment of the present disclosure.

FIG. 1 is a diagram illustrating an error correction circuit 10 according to an embodiment of the present disclosure.

Referring to FIG. 1, the error correction circuit 10 may include an error correction decoder 100 and a post-processor 200.

The error correction decoder 100 may receive read values, and may perform error correction decoding based on the provided read values. The read values may be provided from a memory device 2200 (refer to FIG. 14), and may correspond to a single codeword, which is error correction encoded. That is, the error correction decoder 100 may acquire read values corresponding to a single codeword, which is provided from the memory device 2200.

The error correction decoder 100 may perform error correction decoding based on read values quantized into $g+1$ levels. Each of the read values quantized into $g+1$ levels may be a combined pattern composed of g bits, which will be described with reference to FIGS. 6 to 8. For example, each of the read values quantized into two levels may be '1' or '0' (refer to FIG. 6). For example, each of the read values quantized into three levels may be '11', '10', or '00' (refer to FIG. 7).

When error correction decoding performed based on the read values quantized into $g+1$ levels fails, the error correction decoder 100 may perform error correction decoding based on read values quantized into $g+2$ levels.

Hereinafter, a procedure for performing error correction decoding based on the read values quantized into $g+1$ levels is referred to as a "g-th global iteration". A global iteration may be performed within a maximum global iteration number G. Here, G is a natural number, and g is a natural number less than or equal to G.

The error correction decoder 100 may be a low density parity check (LDPC) decoder that uses an LDPC code as an error-correction code (ECC).

The error correction decoder 100 may include a mapper 110, a node processing component 120, and a syndrome check component 130.

The mapper 110 may receive read values, and may generate read values quantized into $g+1$ levels based on the provided read values. When g is equal to or greater than 2, the read values quantized into $g+1$ levels may be generated by combining read values respectively corresponding to g number of read voltages. For example, read values quantized into three levels may be generated by combining read values corresponding to a first read voltage with read values corresponding to a second read voltage. For this operation, the mapper 110 may include a first buffer 112. The first buffer 112 may receive and store read values respectively corresponding to the g number of read voltages. Therefore, when read values corresponding to a g-th read voltage are provided, the mapper 110 may generate read values quantized into $g+1$ levels by combining read values respectively corresponding to the first to g-th read voltages. When g is 1, read values quantized into two levels may be read values themselves corresponding to a single read voltage.

The mapper 110 may convert the read values quantized into $g+1$ levels into an initial input vector that is used for an iterative decoding scheme. The initial input vector comprises a plurality of initial input values. That is, the mapper 110 may convert respective read values quantized into $g+1$ levels into corresponding initial input values. The initial input values may be values represented by integers or real numbers. The initial input values may include a value indicative of the likelihood that each of symbols contained in a codeword will be 0 or 1 and a reliability value (or confidence value) for the corresponding likelihood. For example, the initial input values may be log likelihood ratio (LLR) values.

The node processing component 120 may perform error correction decoding based on the initial input vector provided from the mapper 110 within each global iteration. The node processing component 120 may perform error correction decoding according to various algorithms which adopt the iterative decoding scheme. For example, the node processing component 120 may perform error correction decoding according to the message passing algorithm (MPA) which may also be referred to as the "belief propagation algorithm (BPA)". By way of example and not limitation, a sum-product algorithm, a minimum (min)-sum algorithm or to the like may be used and, in addition, various algorithms may be used as the message passing algorithm.

The message passing algorithm may generate an output which converges on a desired result via exchange of messages performed between variable nodes and check nodes. The messages may include variable to check (V2C) messages that are sent from the variable nodes to the check nodes and check to variable (C2V) messages that are sent from the check nodes to the variable nodes. A procedure in which, a V2C message is sent from a variable node to a check node and a C2V message is sent from the check node to the variable node and the values of respective nodes are then updated during the message exchange may be a single local iteration. That is, the node processing component 120 may perform a plurality of the single local iterations depending on the iterative decoding scheme within each global iteration.

The node processing component 120 may include a variable node update module 122 and a check node update module 124.

The variable node update module 122 may initialize variable nodes using the initial input vector, for example, LLR values, provided from the mapper 110 to perform a first local iteration. The variable node update module 122 may update the values of the corresponding variable nodes in response to the C2V messages provided from the check node update module 124 in respective local iterations.

A check node update module 124 may update the values of the corresponding check nodes in response to V2C messages provided from the variable node update module 122 in respective local iterations.

The initial input vector and the C2V and V2C messages may be referred to as "soft information". The soft information may include a sign bit and a magnitude bit corresponding to each of symbols belonging to the target codeword of the error correction decoding operation. The sign bit may indicate the likelihood that the corresponding symbol will be 0 or 1. For example, a negative sign bit may indicate that the likelihood of the corresponding symbol being '1' is higher than the likelihood of being '0'. In contrast, the positive sign bit may indicate that the likelihood of the corresponding symbol being '0' is higher than the likelihood of being '1'. The magnitude bit may indicate the reliability value of the corresponding sign bit. For example, as the magnitude bit indicates a larger value, a higher reliability value may be indicated for the corresponding sign bit.

The node processing component 120 may perform the local iteration within a maximum local iteration number I during each global iteration, and may output to the syndrome check component 130 the values of variable nodes (hereinafter referred to as a "variable node vector") as the result of performing an i-th local iteration. Here, I is a natural number, and i is a natural number less than or equal to I.

When a valid codeword that satisfies a parity check matrix of an error-correction code is generated within the maximum local iteration number I, the syndrome check component 130 may output the corresponding valid codeword as a decoded codeword.

For example, the syndrome check component 130 may store in a second buffer 132 the result of performing the i-th local iteration or the variable node vector provided from the node processing component 120 and may perform a syndrome check on the provided variable node vector. For example, the syndrome check may be performed by checking whether all symbols of a syndrome vector $S_i$ calculated by the following Equation 1 are '0'.

$$S_i = H \cdot C_i^T \quad \text{[Equation 1]}$$

Here, $C_i^T$ denotes a transposed matrix of the variable node vector $C_i$, and H denotes a parity check matrix (hereinafter referred to as a "matrix H") for the error-correction code.

A case in which all symbols of the syndrome vector $S_i$ are 0 may mean that the syndrome check has passed. This means that error correction decoding has been successfully performed in the i-th local iteration, and thus the syndrome check component 130 may output the variable node vector $C_i$, stored in the second buffer 132, as a valid codeword, that is, a decoded codeword.

Meanwhile, a case in which symbols other than '0' are present among the symbols of the syndrome vector $S_i$ may mean that a syndrome check has failed. This means that error correction decoding has failed in the i-th local iteration, and thus the node processing component 120 may perform an (i+1)th local iteration when the number of local iterations falls within the maximum local iteration number I. Here, a symbol other than 0, among the symbols of the syndrome vector $S_i$, may correspond to an unsatisfied check node (UCN).

When a valid codeword satisfying the parity check matrix of the error-correction code is not generated within the maximum local iteration number I, the syndrome check component 130 may provide a syndrome vector corresponding to the I-th local iteration to the post-processor 200. The provision of the syndrome vector corresponding to the I-th local iteration may be performed in each global iteration. Therefore, the fact that the syndrome vector corresponding to the I-th local iteration may also corresponds to a g-th global iteration within which the I-th local iteration is performed. Further, a failure of the error correction decoding of the I-th local iteration may also mean a failure of the error correction decoding of the g-th global iteration within which the I-th local iteration is performed.

The post-processor 200 may support the error correction decoder 100 so that the error correction decoder 100 is capable of generating a valid codeword. When error correction decoding fails in the g-th global iteration, the post-processor 200 may control the error correction decoder 100 so that the error correction decoder 100 performs a (g+1)th global iteration within the maximum global iteration number G. That is, when error correction decoding using read values quantized into g+1 levels fails, the post-processor 200 may control the error correction decoder 100 so that the error correction decoder 100 performs error correction decoding using read values quantized into g+2 levels.

In an embodiment, when error correction decoding fails in the g-th global iteration, the post-processor 200 may control the error correction decoder 100 so that (g+1)th to (G−1)th global iterations are skipped and the last G-th global iteration is performed. For example, when it is determined that the likelihood that error correction decoding will succeed is low even if the (g+1)th to (G−1)th global iterations are performed, the post-processor 200 may control the error correction decoder 100 so that the (g+1)th to (G−1)th global iterations are skipped. For this operation, the post-processor 200 may have a global iteration skip policy that is used to decide whether to skip the (g+1)th to (G−1)th global iterations. A description of the global iteration skip policy will be made later with reference to related drawings.

Figure 2:
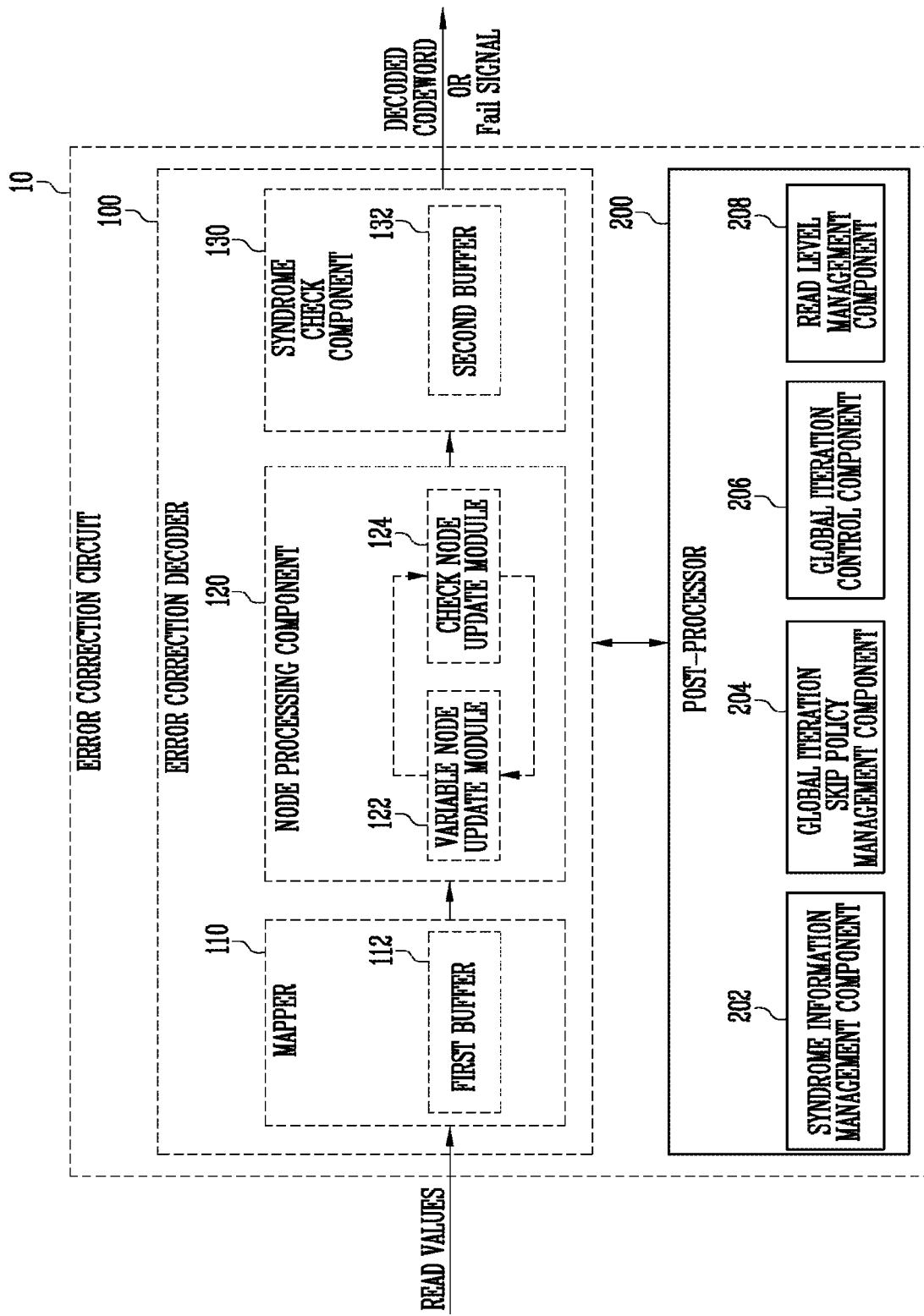
FIG. 2 is a diagram illustrating a post-processor illustrated in FIG. 1.

FIG. 2 is a diagram illustrating the post-processor 200 illustrated in FIG. 1.

Referring to FIG. 2, the post-processor 200 may include a syndrome information management component 202, a global iteration skip policy management component 204, a global iteration control component 206, and a read level management component 208.

The syndrome information management component 202 may receive the syndrome vectors from the syndrome check component 130, and may manage syndrome information regarding the received syndrome vectors. The syndrome information may be information about a syndrome vector corresponding to the last local iteration, among local iterations belonging to each global iteration. That is, the syndrome information management component 202 may receive a syndrome vector corresponding to an I-th local iteration belonging to a g-th global iteration, and may manage syndrome information corresponding to the received syndrome vector. The syndrome information may be information about the number of UCNs included in the corresponding syndrome vector. The syndrome information management component 202 may calculate the number of UCNs included in the received syndrome vector, and may store the calculated number of UCNs to correspond to the index of the corresponding global iteration. The syndrome information may be managed in accordance with a predetermined number of most recent global iterations. For example, the syndrome information may be managed in accordance with each of three most recent global iterations.

The global iteration skip policy management component 204 may manage a global iteration skip policy. For example, the global iteration skip policy may be stored in the global iteration skip policy management component 204. For example, the global iteration skip policy may define various conditions that are used to decide whether to skip some global iterations within the maximum global iteration number G. The global iteration skip policy may define conditions related to syndrome information itself and various types of information that can be estimated from the syndrome information. For example, the global iteration skip policy may define conditions related to at least one of the number of UCNs and a change in the number of UCNs. For example, the global iteration skip policy may define conditions related to at least one of whether the number of UCNs corresponding to a current global iteration is greater than a threshold value, whether the number of UCNs corresponding to the current global iteration is equal to the number of UCNs corresponding to an immediately preceding global iteration, and whether the number of UCNs corresponding to the current global iteration is greater than the number of UCNs corresponding to the immediately preceding global iteration. Here, the threshold value may be a previously set value. In an embodiment, the global iteration skip policy management component 204 may change the threshold value. For example, the global iteration skip policy management component 204 may change the threshold value depending on the number of rows of a matrix H. That is, when an (n, k) code is used, the global iteration skip policy management component 204 may change the threshold value depending on the value of n-k. For example, the global iteration skip policy management component 204 may increase the threshold value as the value of n-k increases. Such an increase may be proportionally performed.

The global iteration control component 206 may control global iterations based on both the syndrome information managed by the syndrome information management component 202 and the global iteration skip policy managed by the global iteration skip policy management component 204. For example, the global iteration control component 206 may receive syndrome information corresponding to a g-th global iteration from the syndrome information management component 202 when error correction decoding fails in the g-th global iteration. In an embodiment, the global iteration control component 206 may receive the global iteration skip policy from the global iteration skip policy management component 204. For example, the global iteration control component 206 may receive the global iteration skip policy before a first global iteration is started. For example, when syndrome information corresponding to the current global iteration satisfies a condition defined in the global iteration skip policy, the global iteration control component 206 may control the error correction decoder 100 so that global iterations in a middle stage are skipped and a last global iteration is performed. For example, when deciding to skip (g+1)th to (G−1)th global iterations, the global iteration control component 206 may control the mapper 110 so that, when all of read values respectively corresponding to G number of read voltages are provided, the mapper 110 generates read values quantized into G+1 levels. For example, when the maximum global iteration number G is 7, and syndrome information corresponding to a second global iteration satisfies a condition defined in the global iteration skip policy, the global iteration control component 206 may control the error correction decoder 100 so that third to sixth global iterations are skipped and a seventh global iteration is performed. That is, the global iteration control component 206 may control the mapper 110 so that the mapper 110 generates read values quantized into eight levels when all of read values respectively corresponding to seven read voltages are provided. This means that the mapper 110 may not generate read values quantized into four, five, six or seven levels, and the node processing component 120 may not perform error correction decoding using the read values quantized into four, five, six or seven levels.

The read level management component 208 may manage the levels of read voltages that are used to acquire read values to be used in each global iteration. For example, assuming that the error correction decoder 100 may perform error correction decoding based on read values quantized into a maximum of three bits, the read level management component 208 may manage the levels of seven read voltages. The read level management component 208 may output a signal requesting read values corresponding to a next read voltage whenever error correction decoding fails within the maximum global iteration number G. When the global iteration control component 206 decides to skip global iterations in a middle stage, the read level management component 208 may output a signal requesting read values that correspond to respective read voltages corresponding to a G-th global iteration. It is assumed that the maximum global iteration number G is 7, and the global iteration control component 206 decides to skip third to sixth global iterations as a result of performing a second global iteration using read values respectively corresponding to first and second read voltages, among seven read voltages. In this case, the read level management component 208 may output a signal requesting read values respectively corresponding to third to seventh read voltages.

Figures 3, 4:
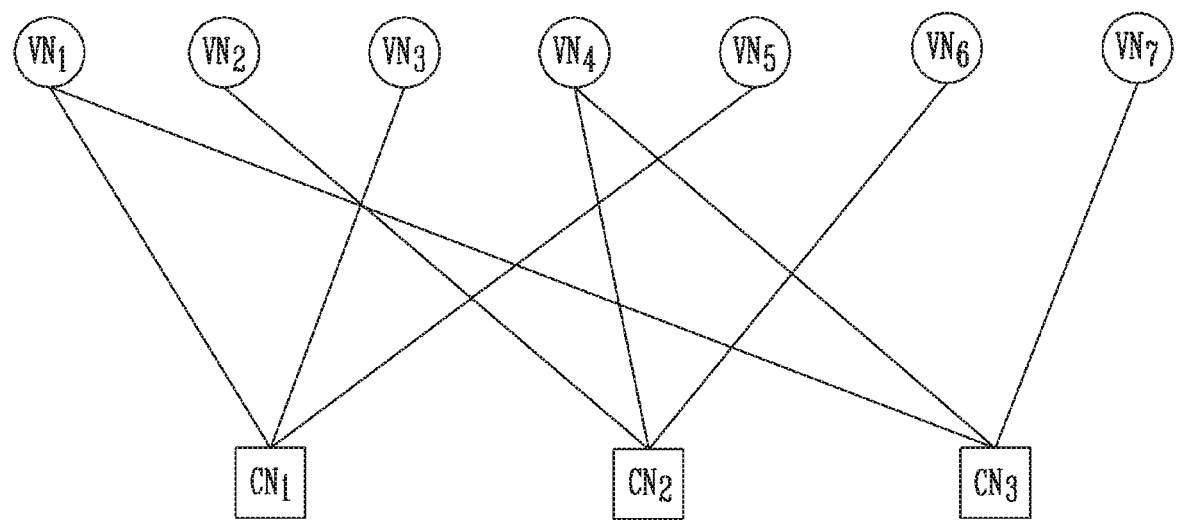
FIG. 3 is a diagram for explaining a matrix H.
FIG. 4 is a diagram illustrating the matrix H of FIG. 3 as a Tanner graph.

FIG. 3 is a diagram for explaining a matrix H.

An (n, k) code may be defined by matrix H having a size of (n−k)×n. Each entry of the matrix H may be represented by 0 or 1, and the (n, k) code may be referred to as an (n, k) LDPC code when the number of 1s included in the matrix H is much smaller than that of 0s. Here, n and k may be natural numbers. In FIG. 3, a matrix H defining a (7, 4) code is illustrated by way of example.

Each entry of the matrix H may be a sub-matrix having a size of m×m. Here, m may be an integer of 2 or more. For example, 0 in the matrix H may indicate that the corresponding entry is a zero matrix, and 1 in the matrix H may indicate that the corresponding entry is not a zero matrix. For example, when the matrix H is a matrix H corresponding to a Quasi Cyclic (QC)-LDPC code, 1 may indicate that the corresponding entry is a circulant matrix. The circulant matrix may be a matrix obtained by cyclically shifting an identity matrix by a predetermined shift value, and any one circulant matrix may have a shift value different from that of another circulant matrix.

FIG. 4 is a diagram illustrating the matrix H of FIG. 3 as a Tanner graph.

An (n, k) code may be represented by a Tanner graph which is a representation of an equivalent bipartite graph. The Tanner graph may be represented by n-k check nodes, n variable nodes, and edges. The check nodes may correspond to rows in the matrix H, and the variable nodes may correspond to columns in the matrix H. Each edge couples one check node to one variable node, and indicates an entry represented by 1 in the matrix H.

The matrix H of the (7, 4) code illustrated in FIG. 3 may be represented by a Tanner graph including three check nodes $CN_1$ to $CN_3$ and seven variable nodes $VN_1$ to $VN_7$, as illustrated in FIG. 4. Solid lines coupling the check nodes $CN_1$ to $CN_3$ to the seven variable nodes $VN_1$ to $VN_7$ may indicate edges.

Iterative decoding may be performed based on an iterative message passing algorithm between the check nodes $CN_1$ to $CN_3$ and the variable nodes $VN_1$ to $VN_7$ on the Tanner graph, such as that illustrated in FIG. 4. That is, in each iteration, iterative decoding may be performed while messages are transferred between the check nodes $CN_1$ to $CN_3$ and the variable nodes $VN_1$ to $VN_7$. The variable nodes may perform error correction using C2V messages provided from check nodes coupled thereto, and the check nodes may perform a check using V2C messages provided from the variable nodes coupled thereto. For the check, a sign bit contained in each V2C message may be used. When a result value obtained by any one check node performing an exclusive OR (XOR) operation on sign bits contained in V2C messages provided from all variable nodes coupled to the check node is 0, the corresponding check node may be determined to be satisfied. In contrast, when the result value obtained by any one check node performing an XOR operation on the sign bits contained in V2C messages provided from all variable nodes coupled to the check node is 1, the check node may be determined to be unsatisfied, and the corresponding check node may be referred to as an "UCN". The values calculated by the check nodes may be identical to syndrome vectors calculated by a variable node vector and the matrix H.

Figures 5, 6:
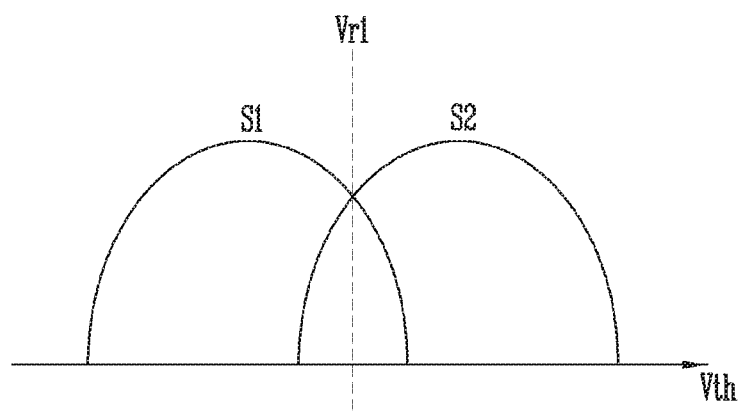
FIG. 5 is a diagram for explaining a syndrome vector calculated using the matrix H of FIG. 3.
FIG. 6 is a diagram for explaining read values quantized into two levels.

FIG. 5 is a diagram for explaining a syndrome vector calculated using the matrix H illustrated in FIG. 3.

As described above, a syndrome vector $S_i$ may be generated based on a transposed vector $C_i^T$ of a variable node vector $C_i$, which is a result value in an i-th local iteration, and the matrix H. Symbols $r_1$, $r_2$, and $r_3$ in the syndrome vector $S_i$ correspond to respective check nodes $CN_1$ to $CN_3$ on the Tanner graph illustrated in FIG. 4.

A case where all symbols $r_1$, $r_2$, and $r_3$ in the syndrome vector $S_i$ represent '0' may mean that a syndrome check has passed. This means that error correction decoding has been successfully performed in the corresponding iteration. Therefore, iterative decoding for the corresponding codeword is terminated, and the variable node vector $C_i$, which is the result value in the i-th local iteration, may be output as a decoded codeword. For example, as illustrated in FIG. 5, assuming that the variable node vector $C_i$ is {1 0 1 1 0 1 0}, all of the symbols $r_1$, $r_2$, and $r_3$ in the syndrome vector $S_i$ may have a value of 0. Therefore, the vector {1 0 1 1 0 1 0} may be determined to be a valid codeword, that is, a decoded codeword.

A case where at least one of all the symbols $r_1$, $r_2$, and $r_3$ in the syndrome vector $S_i$ is not '0' may mean that the syndrome check has not passed. This means that error correction decoding has not succeeded in the corresponding iteration, and thus a next iteration may be performed when the number of iterations does not reach the maximum local iteration number. Here, a symbol which is not '0' represents an unsatisfied check node (UCN).

FIG. 6 is a diagram for explaining read values quantized into two levels.

In FIG. 6, threshold voltage distributions of a plurality of memory cells having any one of a first state 51 and a second state S2 are illustrated.

In order to acquire read values quantized into two levels, one read voltage, for example, a first read voltage Vr1, may be applied to the plurality of memory cells. Read values for memory cells having threshold voltages lower than the first read voltage Vr1 may be indicated by '1', and read values for memory cells having threshold voltages higher than the first read voltage Vr1 may be indicated by '0'. In FIG. 6, first read values corresponding to the first read voltage Vr1 may be regarded as read values quantized into two levels.

The read values quantized into two levels may be converted into LLR values, respectively. In FIG. 6, an example in which, of the read values quantized into two levels, '1' is converted into an LLR value of '-6' and '0' is converted into an LLR value of '+5' is illustrated.

Figure 7:
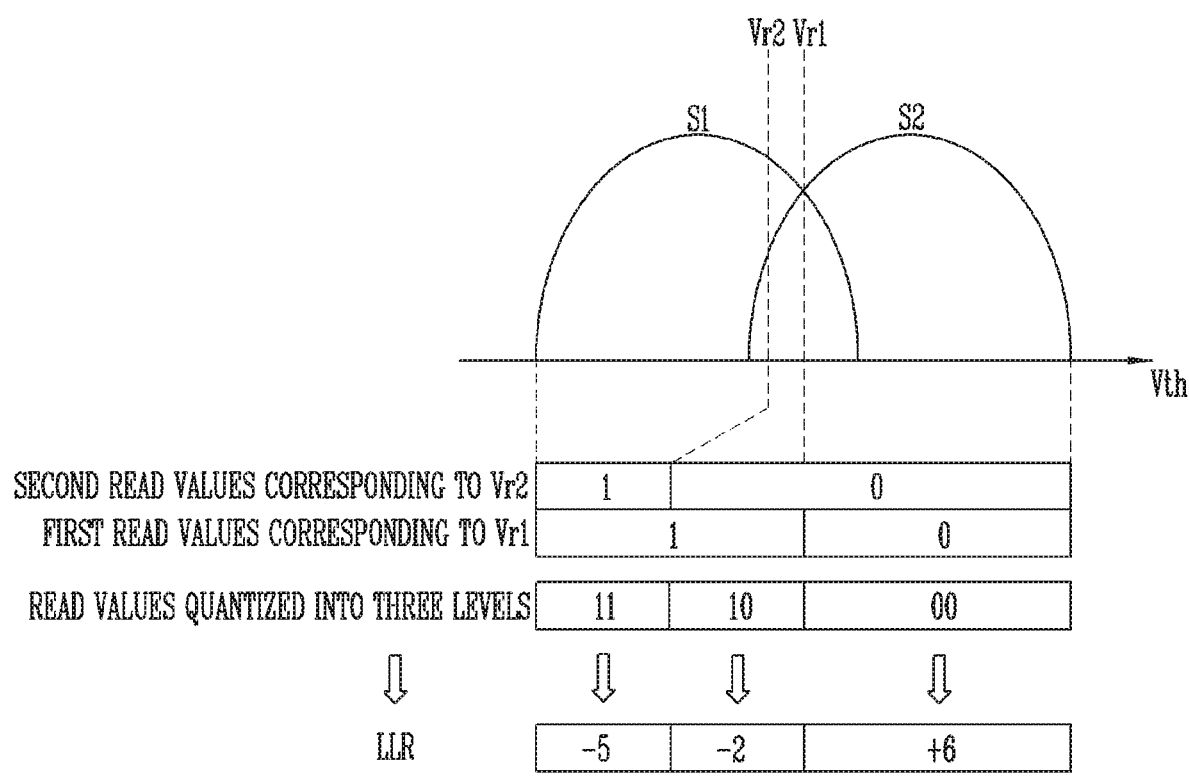
FIG. 7 is a diagram for explaining the generation of read values quantized into three levels.

FIG. 7 is a diagram for explaining the generation of read values quantized into three levels.

In order to acquire read values quantized into three levels, an additional read voltage, for example, a second read voltage Vr2, may be further applied to the plurality of memory cells, in addition to the first read voltage Vr1.

Read values for memory cells having threshold voltages lower than the second read voltage Vr2 may be indicated by '1', and read values for memory cells having threshold voltages higher than the second read voltage Vr2 may be indicated by '0'.

In order to generate the read values quantized into three levels, first read values corresponding to the first read voltage Vr1 and second read values corresponding to the second read voltage Vr2 may be combined with each other. Referring to FIG. 7, it can be seen that the first read values are combined with the second read values, and thus the read values quantized into three levels are generated.

The read values quantized into three levels may be converted into LLR values, respectively. For example, in FIG. 7, of the read values quantized into three levels, '11' is converted into an LLR value of '-5', '10' is converted into an LLR value of '-2', and '00' is converted into an LLR value of '+6'.

Figure 8:
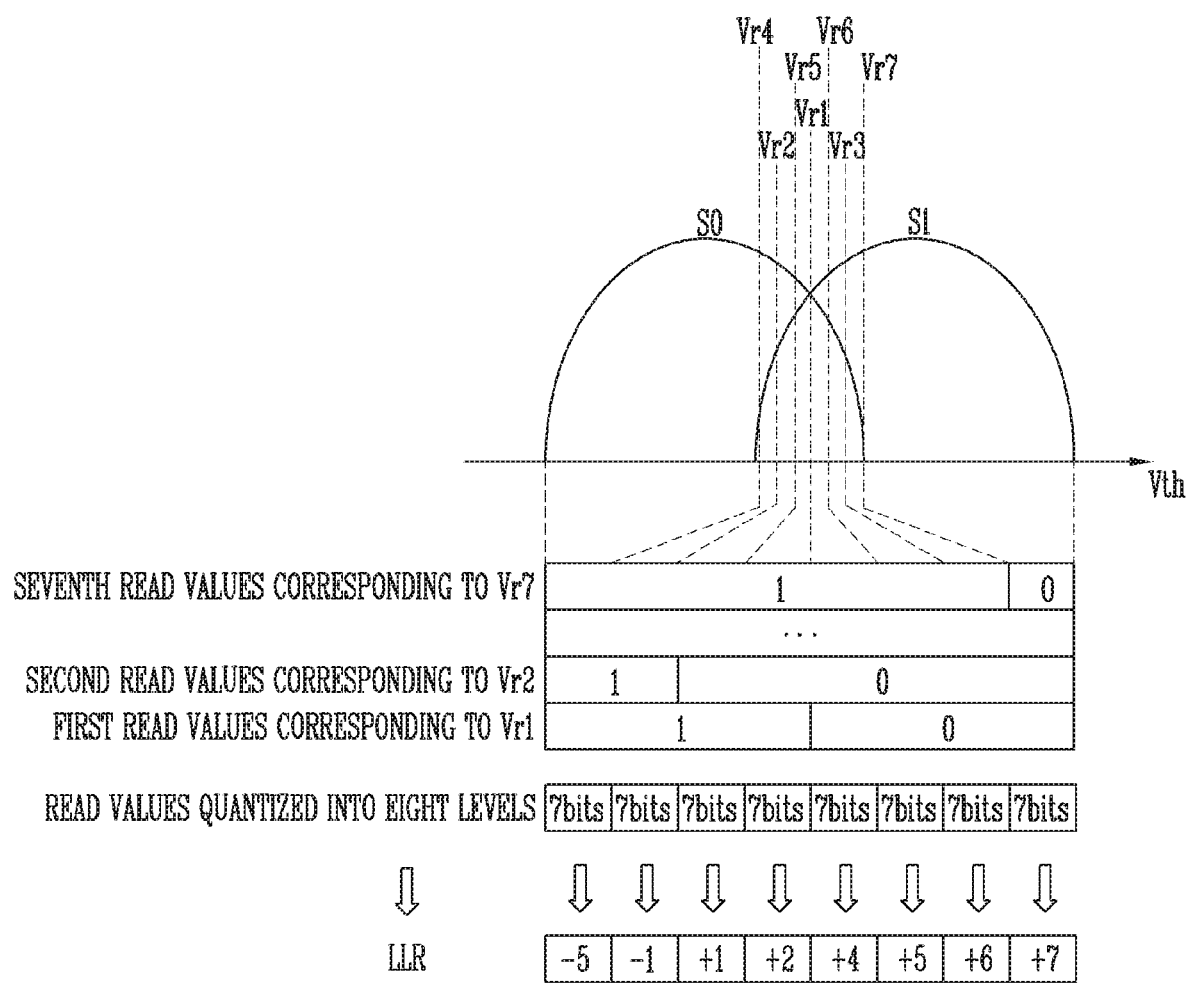
FIG. 8 is a diagram for explaining the generation of read values quantized into eight levels.

FIG. 8 is a diagram for explaining the generation of read values quantized into eight levels.

In order to acquire read values quantized into eight levels, additional read voltages, for example, third to seventh read voltages Vr3 to Vr7, may be further applied to the plurality of memory cells, in addition to the first and second read voltages Vr1 and Vr2.

Read values for memory cells having threshold voltages lower than each read voltage may be indicated by '1', and read values for memory cells having threshold voltages higher than each read voltage may be indicated by '0'.

In order to generate the read values quantized into eight levels, first read values corresponding to the first read voltage Vr1 to seventh read values corresponding to the seventh read voltage Vr7 may be combined with each other. Referring to FIG. 8, it can be seen that the first to seventh read values are combined with each other, and thus the read values quantized into eight levels are generated. When seven read voltages are used, each read value may have a length of 7 bits.

Similar to the configuration described above with reference to FIGS. 6 and 7, the read values quantized into eight levels may be converted into LLR values, respectively.

FIG. 9 is a diagram illustrating a lookup table according to an embodiment of the present disclosure.

The lookup table may be stored in the mapper 110, the error correction decoder 100 or the error correction circuit 10. Referring to FIG. 9, the lookup table may define LLR values respectively corresponding to various quantization levels.

For example, when quantization level is 2, any one of read values quantized into two levels may be converted into a value of LLR1, and the remaining one may be converted into a value of LLR2. For example, of the read values corresponding to one read voltage, '1' may be converted into a value of LLR1, that is, '−6', and '0' may be converted into a value of LLR2, that is, '+5'.

Similarly, each of the read values quantized into g+1 quantization levels may be converted into any one of g+1 LLR values corresponding to respective quantization levels.

FIG. 10 is a flowchart describing a method of operating the error correction circuit 10 illustrated in FIGS. 1 and 2.

At step 1001, the error correction circuit 10 may generate read values quantized into g+1 levels so as to perform a g-th global iteration. For example, in a first global iteration, read values themselves corresponding to one read voltage may be read values quantized into two levels. In global iterations after the first global iteration, read values respectively corresponding to g number of read voltages may be combined with each other so as to generate read values quantized into g+1 levels.

At step 1003, the error correction circuit 10 may convert the read values quantized into g+1 levels into LLR values, respectively. A set lookup table such as the one shown in FIG. 9 may be referred to for conversion of the read values quantized into g+1 levels into LLR values.

At step 1005, the error correction circuit 10 may perform an i-th local iteration within the maximum local iteration number I.

At step 1007, the error correction circuit may perform a syndrome check on a variable node vector which is a result value in the i-th local iteration.

At step 1009, the error correction circuit 10 may determine whether the syndrome check has passed in the i-th local iteration. That is, the error correction circuit 10 may determine whether error correction decoding has succeeded in the i-th local iteration. When it is determined at step 1009 that the syndrome check has passed (that is, "Y" at step 1009), the process may proceed to step 1011, otherwise the process may proceed to step 1021.

At step 1011, the error correction circuit 10 may output the variable node vector, which has passed the syndrome check, as a decoded codeword.

At step 1021, when it is determined at step 1009 that the syndrome check has not passed (that is, "N" at step 1009), the error correction circuit 10 may determine whether a number of local iterations equal to the maximum local iteration number I have been performed.

When it is determined at step 1021 that a number of local iterations equal to the maximum local iteration number I are not performed (that is, "N" at step 1021), a next local iteration, that is, an (i+1)th local iteration, may be performed at step 1005 after going through step 1023.

When it is determined at step 1021 that a number of iterations equal to the maximum local iteration number I are performed (that is, "Y" at step 1021), the process may proceed to step 1031.

At step 1031, the error correction circuit 10 may determine whether a number of global iterations equal to the maximum global iteration number G have been performed. When it is determined at step 1031 that a number of global iterations equal to the maximum global iteration number G have been performed (that is, "Y" at step 1031), the process may proceed to step 1033, otherwise the process may proceed to step 1041.

At step 1033, the error correction circuit 10 may output a fail signal indicating that error correction decoding has failed because a valid codeword is not generated within the maximum global iteration number G.

Meanwhile, at step 1041, when it is determined at step 1031 that a number of global iterations equal to the maximum global iteration number G have not been performed (that is, "N" at step 1031), the error correction circuit 10 may manage syndrome information. For example, the error correction circuit 10 may calculate the number of UCNs of a syndrome vector corresponding to an I-th local iteration belonging to the g-th global iteration, and may store the calculated number of UCNs in accordance with the g-th global iteration. That is, the error correction circuit 10 may manage syndrome information corresponding to the last local iteration belonging to each global iteration.

At step 1043, the error correction circuit may determine whether the syndrome information satisfies a condition defined in the global iteration skip policy.

When it is determined at step 1043 that the syndrome information does not satisfy the condition defined in the global iteration skip policy (that is, "N" at step 1043), a next global iteration, that is, a (g+1)th global iteration, may be performed at step 1001 after going through step 1051.

When it is determined at step 1043 that the syndrome information satisfies the condition defined in the global iteration skip policy (that is, "Y" at step 1043), a G-th global iteration may be performed at step 1001 after going through step 1053. That is, when syndrome information corresponding to the g-th global iteration satisfies the condition defined in the global iteration skip policy, (g+1)th to (G−1)th global iterations may be skipped, and the G-th global iteration may be performed. For example, assuming that the maximum global iteration number G is 7, and a global iteration currently being performed is a second global iteration, third to sixth global iterations may be skipped, and a seventh global iteration may be performed.

FIG. 11 is a diagram illustrating a global iteration skip policy according to an embodiment of the present disclosure.

The global iteration skip policy may define conditions related to at least one of the number of UCNs in a global iteration and a change in the number of UCNs and actions corresponding to the conditions. In FIG. 11, an example in which three conditions are defined is illustrated by way of example.

A first condition represents a case where the number of UCNs in a current global iteration is greater than a threshold value. That is, when the number of UCNs in the current global iteration is excessively large, it is premised that the likelihood of error correction decoding being successfully performed is low even if global iterations in a middle stage are performed. Therefore, the last global iteration may be performed. Here, the threshold value may be experimentally set. In an embodiment, the threshold value may be set depending on the number of rows of a matrix H. That is, when an (n, k) code is used, the threshold value may change depending on the value of n−k. For example, as the value of n−k increases, the threshold value may also increase. Such an increase may be proportionally performed.

The second condition represents a case where the number of UCNs in the current global iteration is equal to the number of UCNs in an immediately preceding global iteration, and the third condition represents a case where the number of UCNs in the current global iteration is greater than the number of UCNs in an immediately preceding global iteration. That is, when the number of UCNs in the current global iteration is equal to (second condition) or greater than (third condition) the number of UCNs in the immediately preceding global iteration, it is premised that the likelihood of error correction decoding being successfully performed is low even if global iterations in a middle stage are performed. Therefore, in order to successfully perform error correction decoding using a sufficient amount of information, the last global iteration may be performed.

FIG. 12 is a diagram illustrating a case where the first condition illustrated in FIG. 11 is satisfied.

In FIG. 12, a syndrome vector corresponding to a first global iteration and the number of UCNs corresponding to the syndrome vector are depicted by way of example.

Assuming that a threshold value is 3 in the first condition illustrated in FIG. 11, the first condition represents a case where the number of UCNs in a current global iteration is greater than 3.

Meanwhile, the syndrome information illustrated in FIG. 12 represents a case where the number of UCNs in the current global iteration (i.e., first global iteration) is 4.

Therefore, assuming that the threshold value is 3, the syndrome information illustrated in FIG. 12 satisfies the first condition illustrated in FIG. 11. Therefore, global iterations in a middle stage may be skipped, and the last global iteration may be performed.

FIGS. 13A and 13B are diagrams illustrating cases where the second condition and the third condition illustrated in FIG. 11 are respectively satisfied.

Referring to FIG. 13A, it can be seen that the number of UCNs in a current global iteration (i.e., 4) is equal to the number of UCNs in an immediately preceding global iteration (i.e., 4).

Referring to FIG. 13B, it can be seen that the number of UCNs in a current global iteration (i.e., 4) is greater than the number of UCNs in an immediately preceding global iteration (i.e., 3).

That is, the syndrome information illustrated in FIG. 13A satisfies the second condition illustrated in FIG. 11, and the syndrome information illustrated in FIG. 13B satisfies the third condition illustrated in FIG. 11.

Therefore, global iterations in a middle stage may be skipped, and the last global iteration may be performed.

Figure 14:
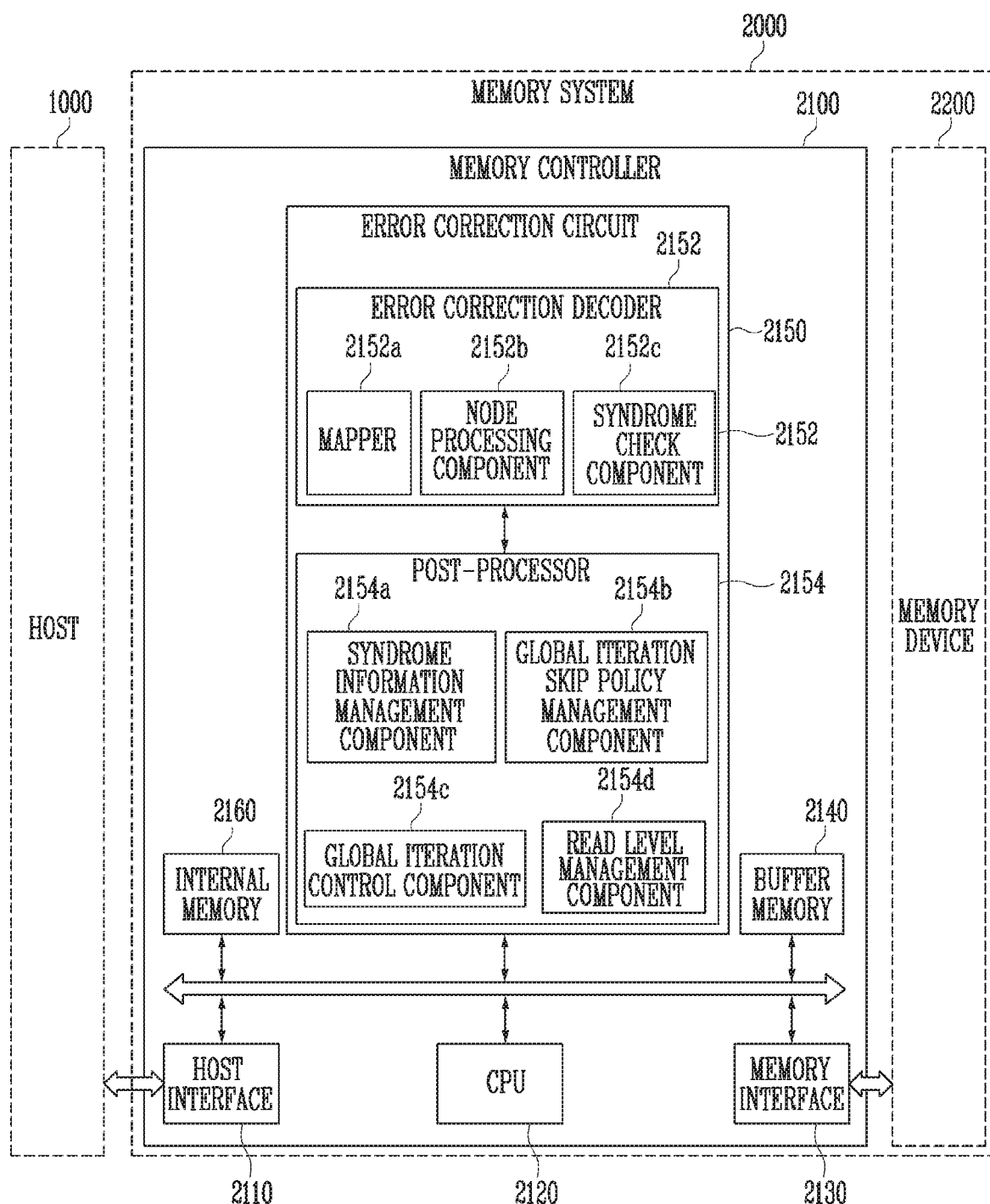
FIG. 14 is a diagram illustrating a memory system according to an embodiment of the present disclosure.

FIG. 14 is a diagram illustrating a memory system 2000 according to an embodiment of the present disclosure.

Referring to FIG. 14, the memory system 2000 may include a memory device 2200 which stores data, and a memory controller 2100 which controls the memory device 2200 under the control of a host 1000.

The host 1000 is capable of communicating with the memory system 2000 using an interface protocol, such as Peripheral Component Interconnect-Express (PCI-e or PCIe), Advanced Technology Attachment (ATA), Serial ATA (SATA), Parallel ATA (PATA) or Serial Attached SCSI (SAS). Interface protocols used between the host 1000 and the memory system 2000 are not limited to the above-described examples, and an interface protocol, such as a Universal Serial Bus (USB), Multi-Media Card (MMC), Enhanced Small Disk Interface (ESDI), or Integrated Drive Electronics (IDE) interface protocol, may be used.

The memory controller 2100 may control the overall operation of the memory system 2000, and may control data exchange between the host 1000 and the memory device 2200. For example, the memory controller 2100 may convert provided information and store and output the converted information so that commands, addresses, and data may be transmitted/received between the host 1000 and the memory device 2200. For example, during a program operation, the memory controller 2100 may transmit commands, addresses, data, etc. to the memory device 2200.

The memory controller 2100 may include a host interface 2110, a Central Processing Unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may perform data exchange with the host 1000 using a communication protocol.

The CPU 2120 may perform various types of calculations or generate commands and addresses so as to control the memory device 2200. For example, the CPU 2120 may generate various commands required for a program operation, a read operation, an erase operation, a data compression operation, and copy-back operations.

The memory interface 2130 may communicate with the memory device 2200 using a communication protocol.

The buffer memory 2140 may temporarily store data while the memory controller 2100 controls the memory device 2200. For example, until the program operation is completed, data provided from the host may be temporarily stored in the buffer memory 2140. Further, during the read operation, data read from the memory device 2200 may also be temporarily stored in the buffer memory 2140.

The error correction circuit 2150, which may correspond to the error correction circuit 10 shown in FIGS. 1 and 2, may perform encoding and decoding for error correction during the program operation or the read operation. The error correction circuit 2150 may include an error correction decoder 2152 (may correspond to the error correction decoder 100 shown in FIGS. 1 and 2) and a post-processor 2154 (may correspond to the post-processor 200 shown in FIGS. 1 and 2).

The error correction decoder 2152 may perform error correction decoding on read data, corresponding to a codeword, from the memory device 2200. The error correction decoder 2152 may correct an error using a matrix H when an error is detected in an iterative decoding procedure for error correction. For example, the error correction decoder 2152 may calculate a syndrome corresponding to the read data based on the matrix H, and may determine, based on the calculated syndrome, whether an error is contained in the read data. The error correction decoder 2152 may correct the error and output error-corrected data when the error contained in the read data is correctable. The error correction decoder 2152 may report a failure in error correction decoding to the CPU 2120 when the error contained in the read data is not correctable.

The error correction decoder 2152 may include a mapper 2152a (may correspond to the mapper 110 shown in FIGS. 1 and 2), a node processing component 2152b (may correspond to the node processing component 120 shown in FIGS. 1 and 2), and a syndrome check component 2152c (may correspond to the syndrome check component 130 shown in FIGS. 1 and 2). The error correction decoder 2152 may perform the same operation as the error correction decoder 100, described above with reference to FIGS. 1 and 2. That is, the mapper 2152a, the node processing component 2152b, and the syndrome check component 2152c illustrated in FIG. 14 may perform operations respectively corresponding to the mapper 110, the node processing component 120, and the syndrome check component 130 illustrated in FIGS. 1 and 2.

The post-processor 2154 may include a syndrome information management component 2154a (may correspond to the syndrome information management component 202 shown in FIG. 2), a global iteration skip policy management component 2154b (may correspond to the global iteration skip policy management component 204 shown in FIG. 2), a global iteration control component 2154c (may correspond to the global iteration control component 206 shown in FIG. 2), and a read level management component 2154d (may correspond to the read level management component 208 shown in FIG. 2). The post-processor 2154 may perform the same operation as the post-processor 200, described above with reference to FIG. 2. That is, the syndrome information management component 2154a, the global iteration skip policy management component 2154b, the global iteration control component 2154c, and the read level management component 2154d, illustrated in FIG. 14, may perform operations respectively corresponding to the syndrome information management component 202, the global iteration skip policy management component 204, the global iteration control component 206, and the read level management component 208, illustrated in FIG. 2.

When deciding to skip (g+1)th to (G−1)th global iterations, the global iteration control component 2154c may control the mapper 2152a so that the mapper 2152a generates read values quantized into G+1 levels when all of read values respectively corresponding to G number of read voltages are provided. For example, when the maximum global iteration number G is 7, and syndrome information corresponding to a second global iteration satisfies a condition defined in the global iteration skip policy, the global iteration control component 2154c may control the mapper 2152a so that third to sixth global iterations are skipped and a seventh global iteration is performed. That is, the global iteration control component 2154c may control the mapper 2152a so that the mapper 2152a generates read values quantized into eight levels when all of read values respectively corresponding to seven read voltages are provided.

When error correction decoding fails in the g-th global iteration, the read level management component 2154d may request the CPU 2120 to perform a read operation corresponding to a (g+1)th read voltage so that read values to be used for the (g+1)th global iteration are provided. Accordingly, the CPU 2120 may transmit commands and addresses to the memory device 2200 so that a read operation corresponding to the (g+1)th read voltage can be performed.

In an embodiment, when deciding to skip (g+1)th to (G−1)th global iterations, the read level management component 2154d may request the CPU 2120 to perform read operations corresponding to the (g+1)th read voltage to the G-th read voltage under the control of the global iteration control component 2154c. Accordingly, the CPU 2120 may transmit commands and addresses to the memory device 2200 so that read operations corresponding to the (g+1)th read voltage to the G-th read voltage can be performed.

The internal memory 2160 may be used as a storage unit which stores various types of information required for the operation of the memory controller 2100. The internal memory 2160 may store a plurality of tables. For example, the internal memory 2160 may store a mapping table for mapping between logical addresses and physical addresses.

The memory device 2200 may perform a program operation, a read operation, an erase operation, a data compression operation, and copy-back operations under the control of the memory controller 2100. The memory device 2200 may be implemented as a volatile memory device in which stored data is lost when the supply of power is interrupted or as a nonvolatile memory device in which stored data is retained even when the supply of power is interrupted.

Figure 15:
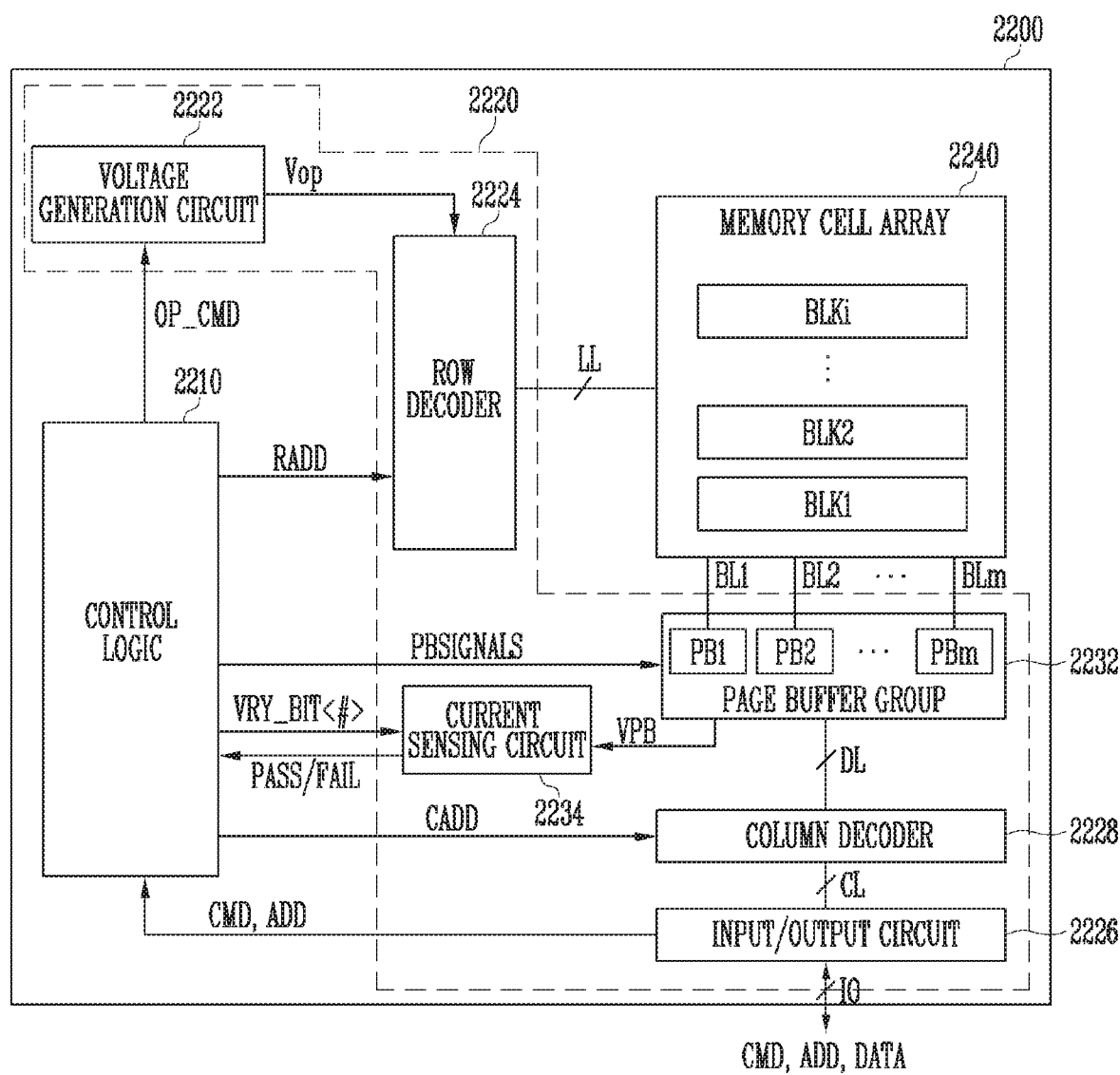
FIG. 15 is a diagram illustrating a memory device according to an embodiment of the present disclosure.

FIG. 15 is a diagram illustrating a memory device 2200 according to an embodiment of the present disclosure. The memory device illustrated in FIG. 15 may correspond to the memory device of FIG. 14.

The memory device 2200 may include a control logic 2210, peripheral circuits 2220 and a memory cell array 2240. The peripheral circuits 2220 may include a voltage generation circuit 2222, a row decoder 2224, an input/output circuit 2226, a column decoder 2228, a page buffer group 2232, and a current sensing circuit 2234.

The control logic 2210 may control the peripheral circuits 2220 under the control of the memory controller 2100 of FIG. 14.

The control logic 2210 may control the peripheral circuits 2220 in response to a command CMD and an address ADD that are provided from the memory controller 2100 through the input/output circuit 2226. For example, the control logic 2210 may output an operation signal OP_CMD, a row address RADD, page buffer control signals PBSIGNALS, an enable bit VRY_BIT<#>, and a column address CADD in response to the command CMD and the address ADD. The control logic 2210 may determine whether a verify operation has passed or failed in response to a pass or fail signal PASS or FAIL provided from the current sensing circuit 2234.

The peripheral circuits 2220 may perform a program operation of storing data in the memory cell array 2240, a read operation of outputting data stored in the memory cell array 2240, and an erase operation of erasing data stored in the memory cell array 2240.

The voltage generation circuit 2222 may generate various operating voltages Vop that are used for the program, read, and erase operations in response to the operation signal OP_CMD provided from the control logic 2210. For example, the voltage generation circuit 2222 may transfer a program voltage, a verify voltage, a pass voltage, a read voltage, an erase voltage, a turn-on voltage, etc. to the row decoder 2224.

The row decoder 2224 may transfer the operating voltages Vop to local lines LL that are coupled to a memory block selected from among memory blocks included in the memory cell array 2240 in response to the row address RADD provided from the control logic 2210. The local lines LL may include local word lines, local drain select lines, and local source select lines. In addition, the local lines LL may include various lines, such as source lines, coupled to memory blocks.

The input/output circuit 2226 may transfer the command CMD and the address ADD, provided from the memory controller through input/output (IO) lines, to the control logic 2210, or may exchange data with the column decoder 2228.

The column decoder 2228 may transfer data between the input/output circuit 2226 and the page buffer group 2232 in response to a column address CADD provided from the control logic 2210. For example, the column decoder 2228 may exchange data with page buffers PB1 to PBm through data lines DL or may exchange data with the input/output circuit 2226 through column lines CL.

The page buffer group 2232 may be coupled to bit lines BL1 to BLm coupled in common to the memory blocks BLK1 to BLKi. The page buffer group 2232 may include a plurality of page buffers PB1 to PBm coupled to the bit lines BL1 to BLm, respectively. For example, one page buffer may be coupled to each bit line. The page buffers PB1 to PBm may be operated in response to the page buffer control signals PBSIGNALS provided from the control logic 2210. For example, during a program operation, the page buffers PB1 to PBm may temporarily store program data provided from the memory controller, and may control voltages to be applied to the bit lines BL1 to BLm based on the program data. Also, during a read operation, the page buffers PB1 to PBm may temporarily store data provided through the bit lines BL1 to BLm or may sense voltages or currents of the bit lines BL1 to BLm.

During a read operation or a verify operation, the current sensing circuit 2234 may generate a reference current in response to the enable bit VRY_BIT<#> provided from the control logic 2210, and may compare a reference voltage, generated by the reference current, with a sensing voltage VPB, provided from the page buffer group 2232, and then output a pass signal PASS or a fail signal FAIL.

The memory cell array 2240 may include a plurality of memory blocks BLK1 to BLKi in which data is stored. In the memory blocks BLK1 to BLKi, user data and various types of information required for the operation of the memory device 2200 may be stored. The memory blocks BLK1 to BLKi may each be implemented as a two-dimensional (2D) structure or a three-dimensional (3D) structure, and may be equally configured.

Figure 16:
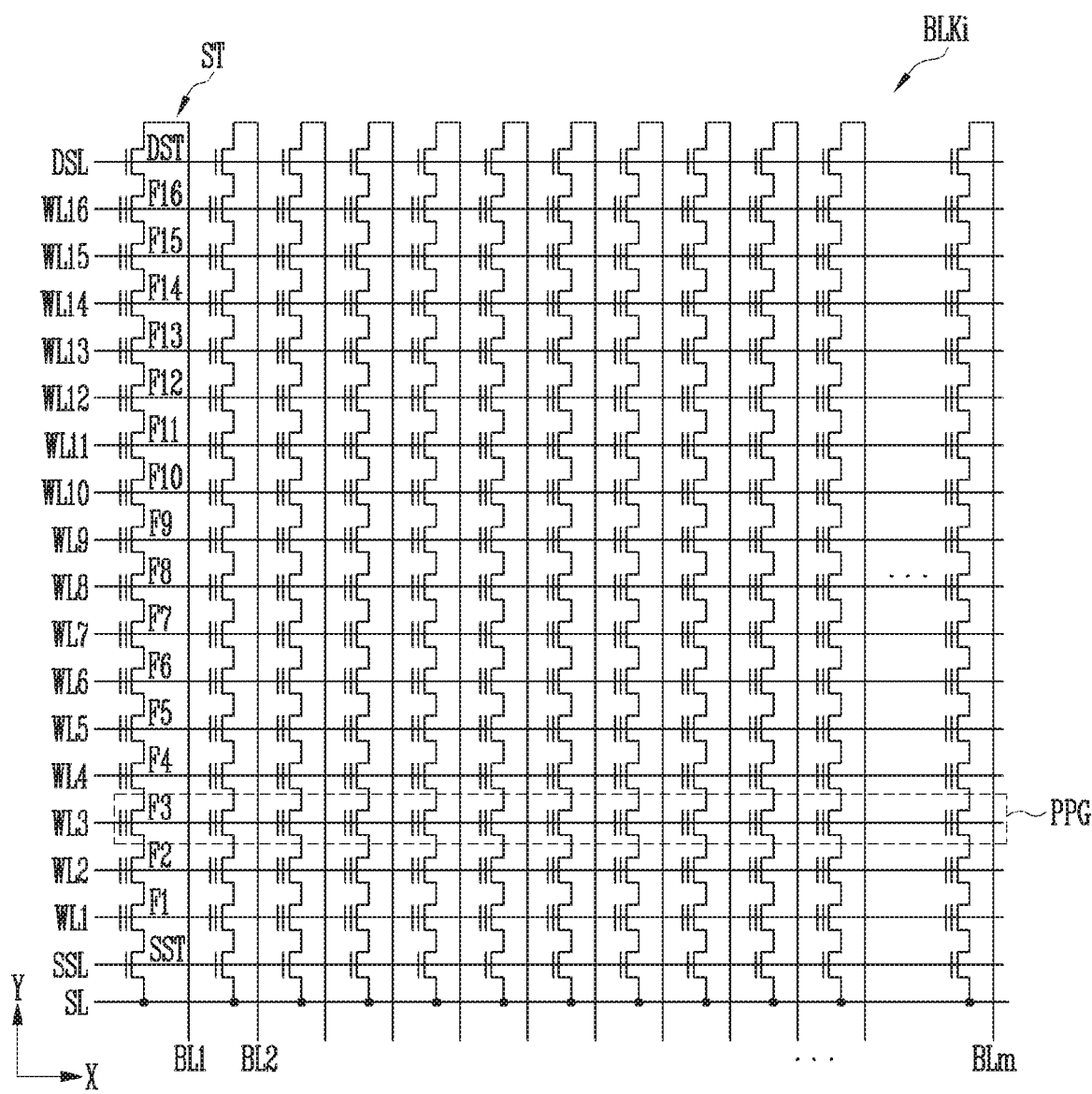
FIG. 16 is a diagram illustrating a memory block.

FIG. 16 is a diagram illustrating a memory block BLKi among the plurality of memory blocks BLK1 to BLKi shown in FIG. 15. The memory block BLKi may correspond to any one memory block among the memory blocks BLK1 to BLKi.

A memory cell array may include a plurality of memory blocks, and any one memory block BLKi of the plurality of memory blocks is illustrated in FIG. 16 for convenience of description.

A plurality of word lines arranged in parallel to each other between a first select line and a second select line may be coupled to the memory block BLKi. Here, the first select line may be a source select line SSL, and the second select line may be a drain select line DSL. In detail, the memory block BLKi may include a plurality of strings ST coupled between bit lines BL1 to BLm and a source line SL. The bit lines BL1 to BLm may be coupled to the strings ST, respectively, and the source line SL may be coupled in common to the strings ST. The strings ST may be equally configured, and thus the string ST coupled to the first bit line BL1 will be described in detail by way of example.

The string ST may include a source select transistor SST, a plurality of memory cells F1 to F16, and a drain select transistor DST which are coupled in series to each other between the source line SL and the first bit line BL1. A single string ST may include at least one source select transistor SST and at least one drain select transistor DST, and more memory cells than the memory cells F1 to F16 illustrated in the drawing may be included in the string ST.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of the source select transistors SST included in different strings ST may be coupled to the source select line SSL, gates of the drain select transistors DST included in different strings ST may be coupled to the drain select line DSL, and gates of the memory cells F1 to F16 may be coupled to a plurality of word lines WL1 to WL16, respectively. A group of memory cells coupled to the same word line, among the memory cells included in different strings ST, may be referred to as a "physical page: PPG". Therefore, the memory block BLKi may include a number of physical pages PPG equal to the number of word lines WL1 to WL16.

One memory cell may store one bit of data. This cell is called a single-level cell (SLC). Here, one physical page PPG may store data corresponding to one logical page LPG. The data corresponding to one logical page LPG may include a number of data bits equal to the number of cells included in one physical page PPG. For example, when two or more bits of data are stored in one memory cell, one physical page PPG may store data corresponding to two or more logical pages LPG. For example, in a memory device driven in an MLC type, data corresponding to two logical pages may be stored in one physical page PPG. In a memory device driven in a TLC type, data corresponding to three logical pages may be stored in one physical page PPG.

Figure 17:
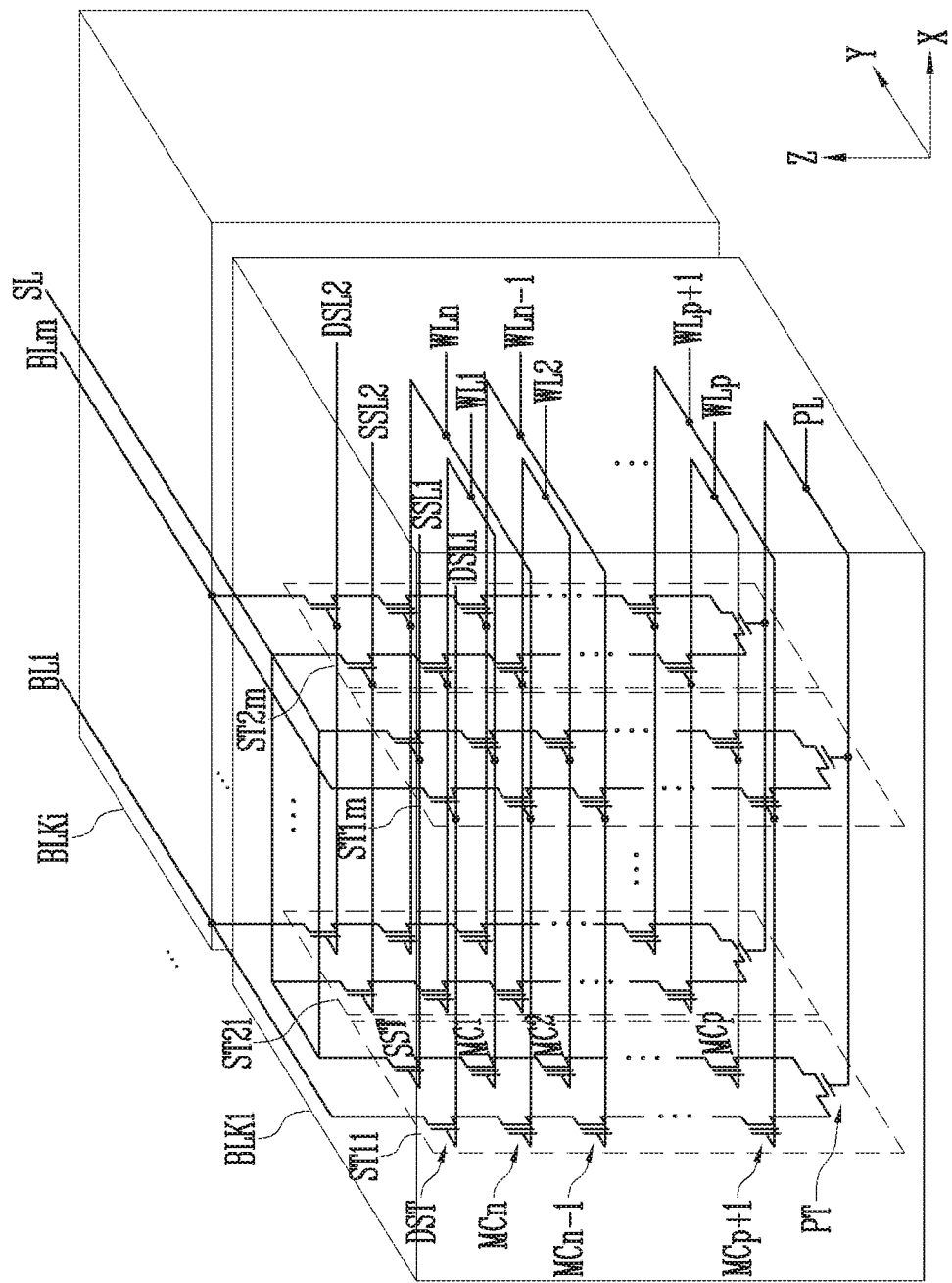
FIG. 17 is a diagram illustrating an example of a memory block having a 3D structure.

FIG. 17 is a diagram illustrating an example of a memory block BLKi having a 3D structure. The memory block BLKi may correspond to any one memory block among the memory blocks BLK1 to BLKi shown in FIG. 15.

A memory cell array 2240 may include a plurality of memory blocks BLK1 to BLKi. When the first memory block BLK1 is described by way of example, the first memory block BLK1 may include a plurality of strings ST11 to ST1m and ST21 to ST2m. In an embodiment, each of the strings ST11 to ST1m and ST21 to ST2m may be formed in a 'U' shape. In the first memory block BLK1, m strings may be arranged in a row direction (e.g., X direction). Although, in FIG. 17, two strings are illustrated as being arranged in a column direction (e.g., Y direction), this embodiment is given for convenience of description, and three or more strings may be arranged in the column direction (e.g., Y direction) in other embodiments.

Each of the plurality of strings ST11 to ST1m and ST21 to ST2m may include at least one source select transistor SST, first to n-th memory cells MC1 to MCn, a pipe transistor PT, and at least one drain select transistor DST.

The source and drain select transistors SST and DST and the memory cells MC1 to MCn may have a similar structure. For example, each of the source and drain select transistors SST and DST and the memory cells MC1 to MCn may include a channel layer, a tunnel insulating layer, a charge trap layer, and a blocking insulating layer. For example, a pillar for providing the channel layer may be provided in each string. For example, a pillar for providing at least one of the channel layer, the tunnel insulating layer, the charge trap layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 17, the source select transistors of the strings ST11 to ST1m in a first row may be coupled to a first source select line SSL1. The source select transistors of the strings ST21 to ST2m in a second row may be coupled to a second source select line SSL2.

In other embodiments, the source select transistors of the strings ST11 to ST1m and ST21 to ST2m may be coupled in common to one source select line.

The first to n-th memory cells MC1 to MCn in each string may be coupled between the source select transistor SST and the drain select transistor DST.

The first to n-th memory cells MC1 to MCn may be divided into first to p-th memory cells MC1 to MCp and p+1-th to n-th memory cells MCp+1 to MCn. The first to p-th memory cells MC1 to MCp may be sequentially arranged in a vertical direction (e.g., Z direction), and may be coupled in series between the source select transistor SST and the pipe transistor PT. The p+1-th to n-th memory cells MCp+1 to MCn may be sequentially arranged in the vertical direction (e.g., Z direction), and may be coupled in series between the pipe transistor PT and the drain select transistor DST. The first to p-th memory cells MC1 to MCp and the p+1-th to n-th memory cells MCp+1 to MCn may be coupled to each other through the pipe transistor PT. Gates of the first to n-th memory cells MC1 to MCn in each string may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. A gate of the pipe transistor PT of each string may be coupled to a pipeline PL.

The drain select transistor DST of each string may be coupled between the corresponding bit line and the memory cells MCp+1 to MCn. Strings arranged in the row direction may be coupled to the corresponding drain select line extending in the row direction. The drain select transistors of the strings ST11 to ST1m in the first row may be coupled to a drain select line DSL1. The drain select transistors of the strings ST21 to ST2m in the second row may be coupled to a second drain select line DSL2.

The strings arranged in the column direction may be coupled to bit lines extending in the column direction. In FIG. 17, the strings ST11 and ST21 in a first column may be coupled to a first bit line BL1. The strings ST1m and ST2m in an m-th column may be coupled to an m-th bit line BLm.

Among strings arranged in the row direction, memory cells coupled to the same word line may constitute one page. For example, memory cells coupled to the first word line WL1, among the strings ST11 to ST1m in the first row, may constitute one page. Among the strings ST21 to ST2m in the second row, memory cells coupled to the first word line WL1 may constitute one additional page. Strings arranged in the direction of one row may be selected by selecting any one of the drain select lines DSL1 and DSL2. One page may be selected from the selected strings by selecting any one of the word lines WL1 to WLn.

Figure 18:
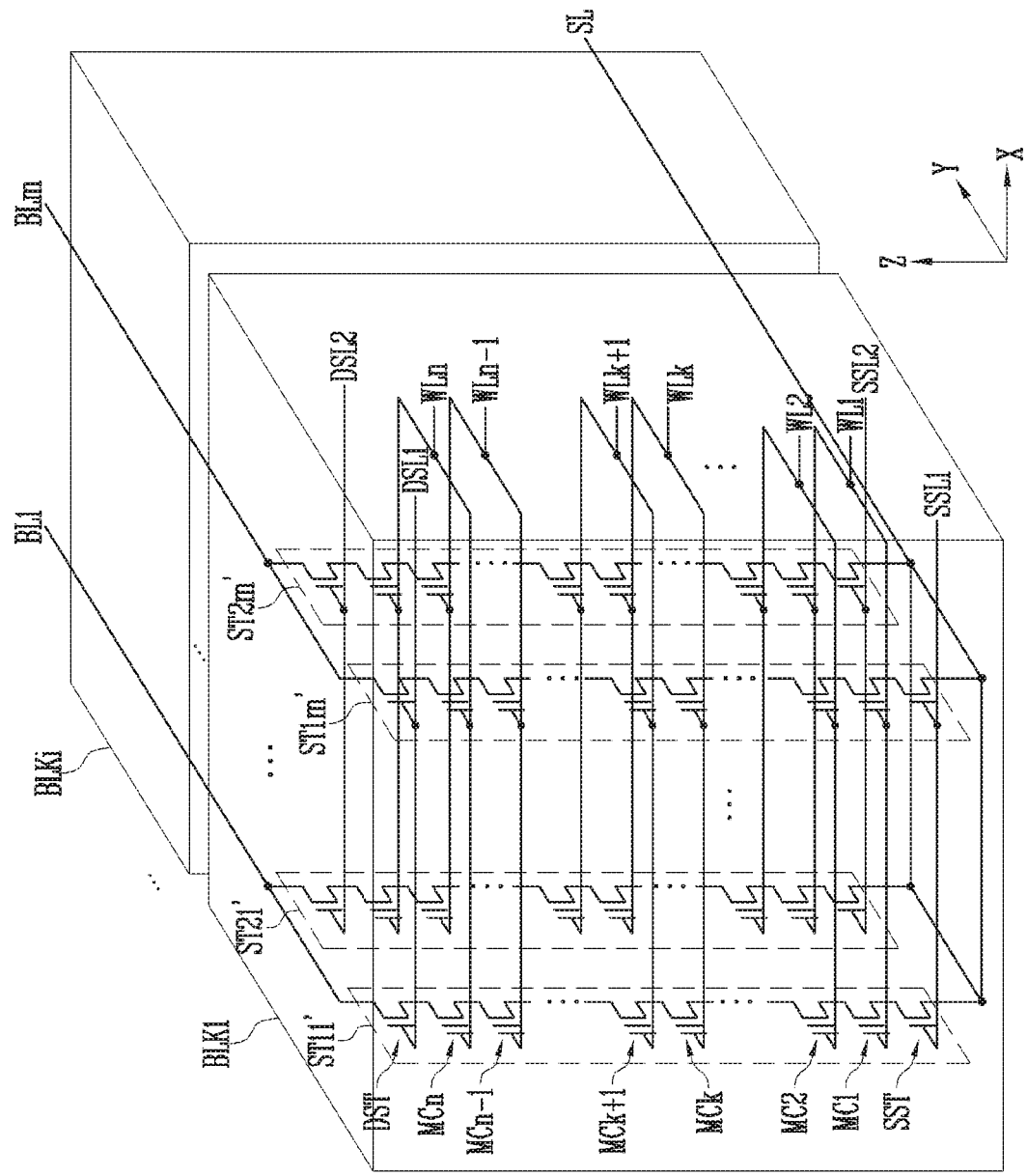
FIG. 18 is a diagram illustrating an example of a memory block having a 3D structure.

FIG. 18 is a diagram illustrating an example of a memory block BLKi having a 3D structure. The memory block BLKi may correspond to any one memory block among the memory blocks BLK1 to BLKi shown in FIG. 15.

A memory cell array 2240 includes a plurality of memory blocks BLK1 to BLKi. When the first memory block BLK1 is described by way of example, the first memory block BLK1 may include a plurality of strings ST11' to ST1m' and ST21' to ST2m'. Each of the strings ST11' to ST1m' and ST21' to ST2m' may extend along a vertical direction (e.g., Z direction). In the memory block BLKi, m strings may be arranged in a row direction (e.g., X direction). Although, in FIG. 18, two strings are illustrated as being arranged in a column direction (e.g., Y direction), this embodiment is given for convenience of description, and three or more strings may be arranged in the column direction (e.g., Y direction) in other embodiments.

Each of the strings ST11' to ST1m' and ST21' to ST2m' may include at least one source select transistor SST, first to n-th memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. The source select transistors of the strings ST11' to ST1m' arranged in a first row may be coupled to a first source select line SSL1. The source select transistors of the strings ST21' to ST2m' arranged in a second row may be coupled to a second source select line SSL2. In an embodiment, the source select transistors of the strings ST11' to ST1m' and ST21' to ST2m' may be coupled in common to one source select line.

The first to n-th memory cells MC1 to MCn in each string may be coupled in series between the source select transistor SST and the drain select transistor DST. Gates of the first to n-th memory cells MC1 to MCn may be coupled to first to n-th word lines WL1 to WLn, respectively.

In an embodiment, at least one of the first to n-th memory cells MC1 to MCn may be used as a dummy memory cell. When the dummy memory cell is provided, the voltage or current of the corresponding string may be stably controlled. Thereby, the reliability of data stored in the first memory block BLK1 may be improved.

The drain select transistor DST of each string may be coupled between the corresponding bit line and the memory cells MC1 to MCn. The drain select transistors DST of strings arranged in the row direction may be coupled to a drain select line extending along the row direction. The drain select transistors DST of the strings ST11' to ST1m' in the first row may be coupled to a first drain select line DSL1. The drain select transistors DST of the strings ST21' to ST2m' in the second row may be coupled to a second drain select line DSL2.

That is, the first memory block BLK1 of FIG. 18 may have a circuit similar to that of the first memory block BLK1 of FIG. 17 except that a pipe transistor PT is excluded from each string.

Figure 19:
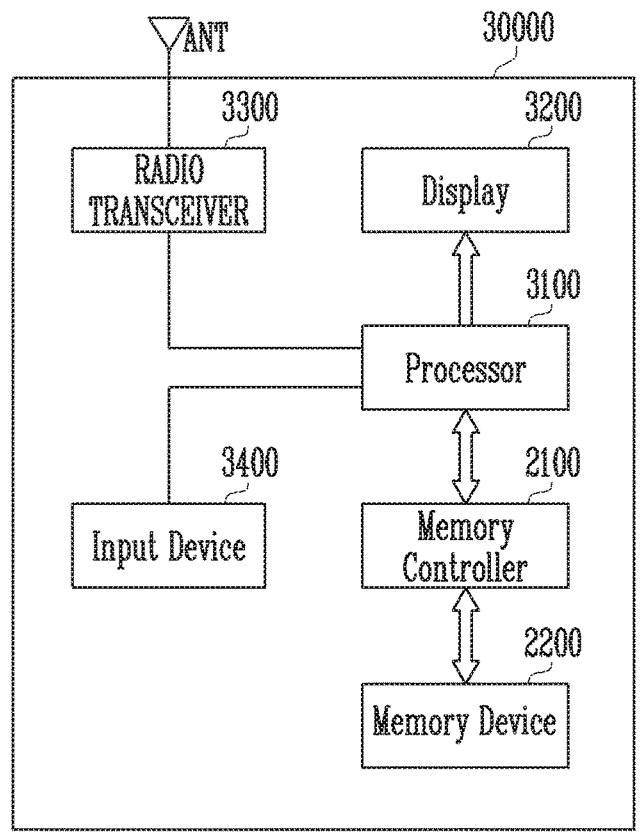
FIGS. 19 to 22 are diagrams illustrating an embodiment of a memory system including the memory controller of FIG. 14.

FIG. 19 is a diagram illustrating an embodiment of a memory system including the memory controller of FIG. 14.

Referring to FIG. 19, a memory system 30000 may be implemented as a cellular phone, a smartphone, a tablet, a personal computer (PC), a personal digital assistant (PDA) or a wireless communication device. The memory system 30000 may include a memory device 2200 and a memory controller 2100 that is capable of controlling the operation of the memory device 2200.

The memory controller 2100 may control a data access operation, e.g., a program, erase, or read operation, of the memory device 2200 under the control of a processor 3100.

Data programmed in the memory device 2200 may be output through a display 3200 under the control of the memory controller 2100.

A radio transceiver 3300 may send and receive radio signals through an antenna ANT. For example, the radio transceiver 3300 may change a radio signal provided through the antenna ANT into a signal which may be processed by the processor 3100. Therefore, the processor 3100 may process a signal output from the radio transceiver 3300 and transmit the processed signal to the memory controller 2100 or the display 3200. The memory controller 2100 may transmit a signal processed by the processor 3100 to the memory device 2200. Furthermore, the radio transceiver 3300 may change a signal output from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data output from the memory controller 2100, data output from the radio transceiver 3300, or data output from the input device 3400 is output through the display 3200.

In an embodiment, the memory controller 2100 capable of controlling the operation of the memory device 2200 may be implemented as a part of the processor 3100 or as a chip provided separately from the processor 3100.

Figure 20:
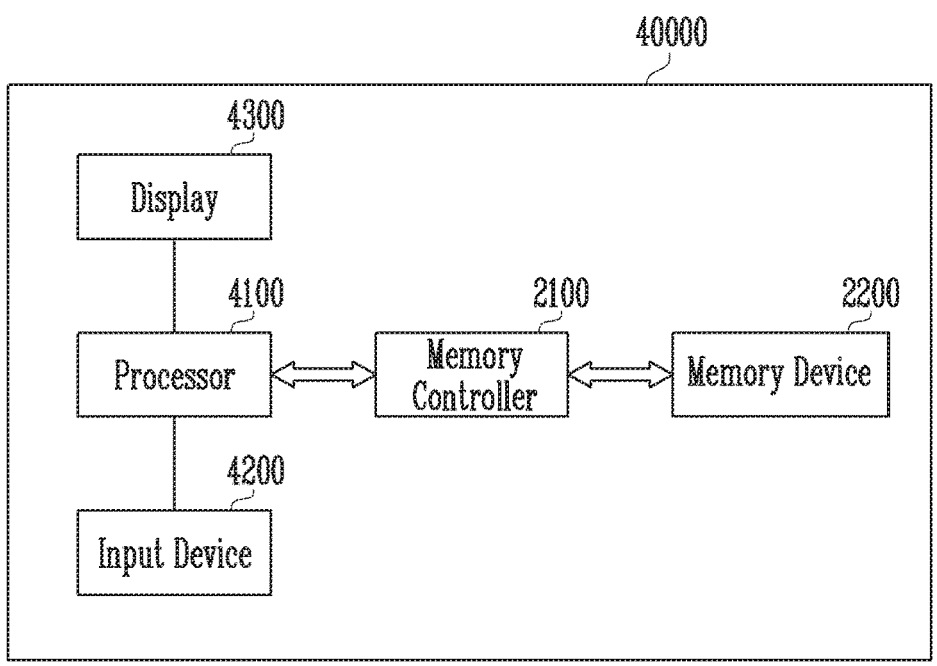

FIG. 20 is a diagram illustrating an embodiment of a memory system including the memory controller of FIG. 14.

Referring to FIG. 20, a memory system 40000 may be embodied in a personal computer, a tablet, a net-book, an e-reader, a personal digital assistant (PDA), a portable multimedia player (PMP), an MP3 player, or an MP4 player.

The memory system 40000 may include a memory device 2200 and a memory controller 2100 that is capable of controlling the data processing operation of the memory device 2200.

A processor 4100 may output data stored in the memory device 2200 through a display 4300, according to data input from an input device 4200. For example, the input device 4200 may be implemented as a point device such as a touch pad or a computer mouse, a keypad or a keyboard.

The processor 4100 may control the overall operation of the memory system 40000 and control the operation of the memory controller 2100. In an embodiment, the memory controller 2100 capable of controlling the operation of the memory device 2200 may be implemented as a part of the processor 4100 or as a chip provided separately from the processor 4100.

Figure 21:
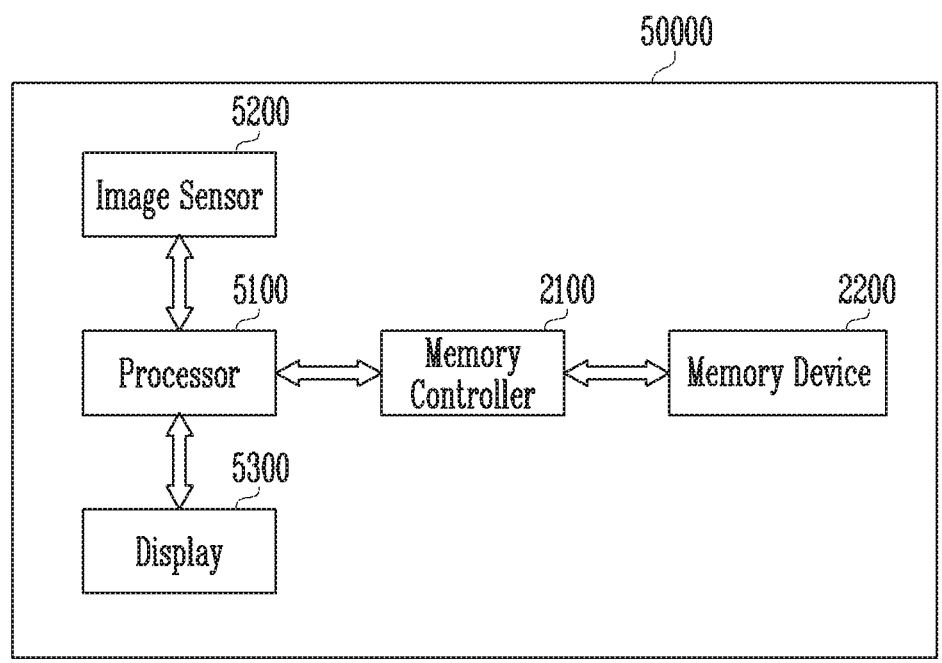

FIG. 21 is a diagram illustrating an embodiment of a memory system including the memory controller of FIG. 14.

Referring to FIG. 21, a memory system 50000 may be embodied in an image processing device, e.g., a digital camera, a portable phone provided with a digital camera, a smartphone provided with a digital camera, or a tablet provided with a digital camera.

The memory system 50000 may include a memory device 2200 and a memory controller 2100 that is capable of controlling a data processing operation, e.g., a program, erase, or read operation, of the memory device 2200.

An image sensor 5200 of the memory system 50000 may convert an optical image into digital signals. The converted digital signals may be transmitted to a processor 5100 or the memory controller 2100. Under the control of the processor 5100, the converted digital signals may be output through a display 5300 or stored in the memory device 2200 through the memory controller 2100. Data stored in the memory device 2200 may be output through the display 5300 under the control of the processor 5100 or the memory controller 2100.

In an embodiment, the memory controller 2100 capable of controlling the operation of the memory device 2200 may be implemented as a part of the processor 5100, or as a chip provided separately from the processor 5100.

Figure 22:
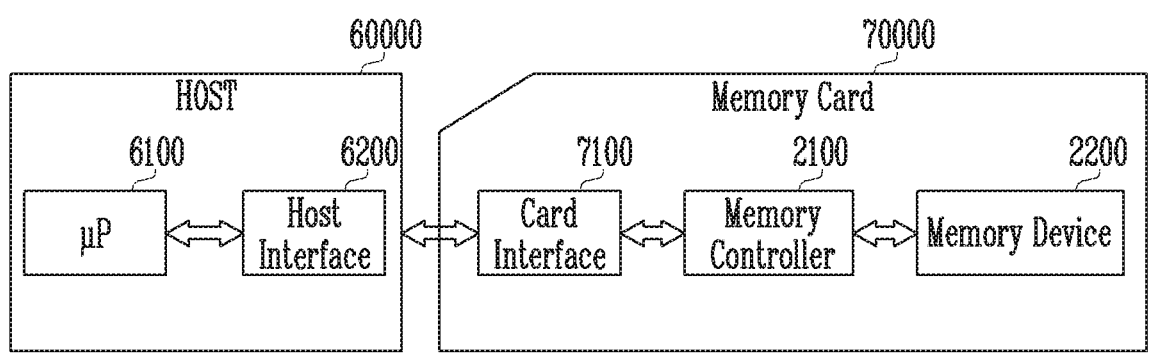

FIG. 22 is a diagram illustrating an embodiment of a memory system including the memory controller of FIG. 14.

Referring to FIG. 22, a memory system 70000 may be embodied in a memory card or a smart card. The memory system 70000 may include a memory device 2200, a memory controller 2100, and a card interface 7100.

The memory controller 2100 may control data exchange between the memory device 2200 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 2100 according to a protocol of the host 60000. In an embodiment, the card interface 7100 may support a universal serial bus (USB) protocol, and an interchip (IC)-USB protocol. Here, the card interface 7100 may refer to hardware capable of supporting a protocol which is used by the host 60000, software installed in the hardware, or a signal transmission method.

When the memory system 70000 is connected to a host interface 6200 of the host 60000 such as a PC, a tablet, a digital camera, a digital audio player, a cellular phone, console video game hardware or a digital set-top box, the host interface 6200 may perform data communication with the memory device 2200 through the card interface 7100 and the memory controller 2100 under the control of a microprocessor (μP) 6100.

In accordance with the present disclosure, the time required for error correction decoding may be reduced.

While the exemplary embodiments of the present disclosure have been disclosed for illustrative purposes, those skilled in the art will appreciate that various modifications, additions and substitutions are possible. Therefore, the scope of the present disclosure must be defined by the appended claims and equivalents of the claims rather than by the description preceding them.

What is claimed is:

1. An error correction circuit for performing error correction decoding within a maximum global iteration number G (where G is a natural number), comprising:
   a mapper configured to generate read values quantized into g+1 levels to be used in a g-th global iteration by using read values respectively corresponding to g number of read voltages (where g is a natural number less than or equal to G);
   a node processing component configured to perform error correction decoding, during the g-th global iteration, by using the read values quantized into g+1 levels;

a syndrome information management component configured to manage syndrome information corresponding to the g-th global iteration; and a global iteration control component configured to, when error correction decoding fails in the g-th global iteration, determine whether the syndrome information corresponding to the g-th global iteration satisfies a condition defined in a global iteration skip policy, and decide whether to skip (g+1)th to (G−1)th global iterations based on a result of the determination, wherein the global iteration skip policy defines a condition related to at least one of:

whether a number of unsatisfied check nodes (UCNs) corresponding to a current global iteration is equal to the number of UCNs corresponding to an immediately preceding global iteration; and whether the number of UCNs corresponding to the current global iteration is greater than the number of UCNs corresponding to the immediately preceding global iteration.

2. The error correction circuit according to claim 1, wherein the global iteration control component is configured to decide, when the syndrome information corresponding to the g-th global iteration satisfies the condition, to skip the (g+1)th to (G−1)th global iterations.

3. The error correction circuit according to claim 2, wherein the global iteration control component is configured to control, when deciding to skip the (g+1)th to (G−1)th global iterations, the mapper so that the mapper generates read values quantized into G+1 levels when all of read values respectively corresponding to G number of read voltages are provided.

4. The error correction circuit according to claim 1, wherein the node processing component performs a plurality of local iterations within a maximum local iteration number I (where I is a natural number) during the g-th global iteration.

5. The error correction circuit according to claim 4, wherein:

the syndrome information management component is configured to store information related to a syndrome vector that is generated in an I-th local iteration belonging to the g-th global iteration, as the syndrome information corresponding to the g-th global iteration, and the global iteration control component is configured to receive, when error correction decoding fails in the g-th global iteration, syndrome information corresponding to the g-th global iteration from the syndrome information management component.

6. The error correction circuit according to claim 1, wherein the global iteration control component receives the global iteration skip policy from a global iteration skip policy management component that stores the global iteration skip policy.

7. The error correction circuit according to claim 6, wherein the global iteration skip policy further defines a condition related to whether the number of UCNs corresponding to the current global iteration is greater than a threshold value.

8. The error correction circuit according to claim 7, wherein the global iteration skip policy management component changes the threshold value depending on a number of rows in a parity check matrix used for the error correction decoding.

9. The error correction circuit according to claim 1, wherein:

the mapper converts the read values quantized into g+1 levels into log likelihood ratio (LLR) values, respectively, and the node processing component comprises:

a variable node update module configured to initialize variable nodes using LLR values provided from the mapper and update the variable nodes based on Check to Variable (C2V) messages provided from check nodes; and a check node update module configured to update the check nodes based on Variable to Check (V2C) messages provided from the variable nodes.

10. A method of operating an error correction circuit, in which the error correction circuit performs error correction decoding within a maximum global iteration number G (where G is a natural number), the method comprising:

generating read values quantized into g+1 levels to be used in a g-th global iteration by using read values respectively corresponding to g number of read voltages (where g is a natural number less than or equal to G);

performing error correction decoding, during the g-th global iteration, by using the read values quantized into g+1 levels;

managing syndrome information corresponding to the g-th global iteration;

determining, when error correction decoding fails in the g-th global iteration, whether the syndrome information corresponding to the g-th global iteration satisfies a condition defined in a global iteration skip policy; and deciding whether to skip (g+1)th to (G−1)th global iterations depending on whether syndrome information satisfies the condition, wherein the global iteration skip policy defines a condition related to at least one of:

whether a number of unsatisfied check nodes (UCNs) corresponding to a current global iteration is equal to the number of UCNs corresponding to an immediately preceding global iteration; and whether the number of UCNs corresponding to the current global iteration is greater than the number of UCNs corresponding to the immediately preceding global iteration.

11. The method according to claim 10, further comprising:

skipping, when the syndrome information corresponding to the g-th global iteration satisfies the condition, the (g+1)th to (G−1)th global iterations and performing a G-th global iteration.

12. The method according to claim 11, further comprising:

generating, when deciding to skip the (g+1)th to (G−1)th global iterations, read values quantized into G+1 levels when all of read values respectively corresponding to G number of read voltages are provided.

13. The method according to claim 10, wherein the g-th global iteration comprises a plurality of local iterations in which error correction decoding is performed using an iterative decoding scheme within a maximum local iteration number I (where I is a natural number).

14. The method according to claim 13, wherein the syndrome information is information related to a syndrome vector generated in an I-th local iteration.

15. The method according to claim 10, wherein the global iteration skip policy further defines a condition related to whether the number of UCNs corresponding to the current global iteration is greater than a threshold value.

16. The method according to claim 15, wherein the threshold value is, when the error correction decoding is performed based on an (n, k) code, set depending on a value of n−k.

17. The method according to claim 10, wherein the g-th global iteration comprises:
   converting the read values quantized into g+1 levels into log likelihood ratio (LLR) values, respectively, and
   performing error correction decoding based on the converted LLR values.

18. The method according to claim 10, wherein performing the error correction decoding comprises performing the error correction decoding based on a low density parity check (LDPC) code.

* * * * *